(12) United States Patent
Lee et al.

(10) Patent No.: US 10,991,597 B2
(45) Date of Patent: Apr. 27, 2021

(54) METHOD OF FABRICATING A SEMICONDUCTOR DEVICE USING AN ADHESIVE LAYER

(71) Applicant: SAMSUNG ELECTRONICS CO., LTD., Suwon-si (KR)

(72) Inventors: Kyung-Hak Lee, Yongin-si (KR); Jaeyong Park, Cheonan-si (KR); Jun-su Lim, Hwaseong-si (KR); Sungil Cho, Asan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 16/657,708

(22) Filed: Oct. 18, 2019

(65) Prior Publication Data
US 2020/0303209 A1    Sep. 24, 2020

(30) Foreign Application Priority Data

Mar. 20, 2019 (KR) ........................ 10-2019-0032017

(51) Int. Cl.
| | | |
|---|---|---|
| *H01L 21/463* | (2006.01) | |
| *H01L 21/683* | (2006.01) | |
| *H01L 21/56* | (2006.01) | |
| *H01L 21/48* | (2006.01) | |
| *H01L 21/52* | (2006.01) | |
| *H01L 23/48* | (2006.01) | |
| *H01L 25/065* | (2006.01) | |
| *H01L 23/538* | (2006.01) | |
| *H01L 25/00* | (2006.01) | |

(52) U.S. Cl.
CPC .......... *H01L 21/463* (2013.01); *H01L 21/486* (2013.01); *H01L 21/52* (2013.01); *H01L 21/561* (2013.01); *H01L 21/6835* (2013.01); *H01L 21/6836* (2013.01); *H01L 23/481* (2013.01); *H01L 23/5386* (2013.01); *H01L 25/0652* (2013.01); *H01L 25/50* (2013.01)

(58) Field of Classification Search
CPC ..... H01L 21/561; H01L 21/463; H01L 21/52; H01L 21/6836; H01L 21/486
See application file for complete search history.

(56) References Cited

U.S. PATENT DOCUMENTS

| | | | |
|---|---|---|---|
| 8,017,439 B2 | 9/2011 | Takahashi et al. | |
| 9,029,269 B2 | 5/2015 | Bourbina et al. | |
| 9,412,636 B2 | 8/2016 | Lee et al. | |
| 9,412,707 B2 | 8/2016 | Chung et al. | |
| 9,586,291 B2 | 3/2017 | Dang et al. | |
| 9,929,128 B1* | 3/2018 | Cheng | H01L 21/565 |
| 9,966,295 B2 | 5/2018 | Koyama et al. | |
| 2007/0080434 A1* | 4/2007 | Ho | H01L 24/32 257/666 |
| 2011/0217501 A1* | 9/2011 | Shishido | H01L 21/6836 428/41.8 |

(Continued)

*Primary Examiner* — Ahmed N Sefer
(74) *Attorney, Agent, or Firm* — F. Chau & Associates, LLC

(57) ABSTRACT

A method of fabricating a semiconductor device is provided in which an adhesive layer is disposed on a first surface of a first semiconductor substrate. A carrier substrate is provided on the first surface of the first semiconductor substrate, and the carrier substrate is separated from a surface of the adhesive layer while the adhesive layer is still attached to the first surface of the first semiconductor substrate.

19 Claims, 23 Drawing Sheets

(56) References Cited

U.S. PATENT DOCUMENTS

| | | | |
|---|---|---|---|
| 2012/0052654 A1* | 3/2012 | Yang | H01L 21/486 |
| | | | 438/458 |
| 2012/0104624 A1* | 5/2012 | Choi | H01L 25/16 |
| | | | 257/774 |
| 2014/0070403 A1* | 3/2014 | Pan | H01L 24/19 |
| | | | 257/737 |
| 2015/0115433 A1* | 4/2015 | Lin | H01L 23/3675 |
| | | | 257/712 |
| 2015/0221517 A1 | 8/2015 | Kim et al. | |
| 2016/0013147 A1* | 1/2016 | Cheng | |
| 2016/0133486 A1 | 5/2016 | Andry et al. | |
| 2016/0276174 A1* | 9/2016 | Kim | H01L 21/6835 |
| 2017/0092581 A1* | 3/2017 | Chiu | H01L 21/4853 |
| 2017/0287782 A1* | 10/2017 | Dang | H01L 23/3107 |
| 2018/0002569 A1 | 1/2018 | John et al. | |
| 2018/0063963 A1 | 3/2018 | Flaim | |
| 2018/0264797 A1 | 9/2018 | Zhang | |
| 2018/0269077 A1 | 9/2018 | Zhang | |
| 2018/0281361 A1* | 10/2018 | Oda | B32B 27/00 |
| 2019/0006257 A1* | 1/2019 | Hsu | H01L 23/481 |
| 2019/0006315 A1* | 1/2019 | Hsu | H01L 21/6835 |
| 2019/0096840 A1* | 3/2019 | Ang | H01L 24/11 |
| 2019/0148330 A1* | 5/2019 | Chen | H01L 24/20 |
| | | | 257/774 |
| 2019/0295972 A1* | 9/2019 | Tsai | H01L 21/561 |

* cited by examiner

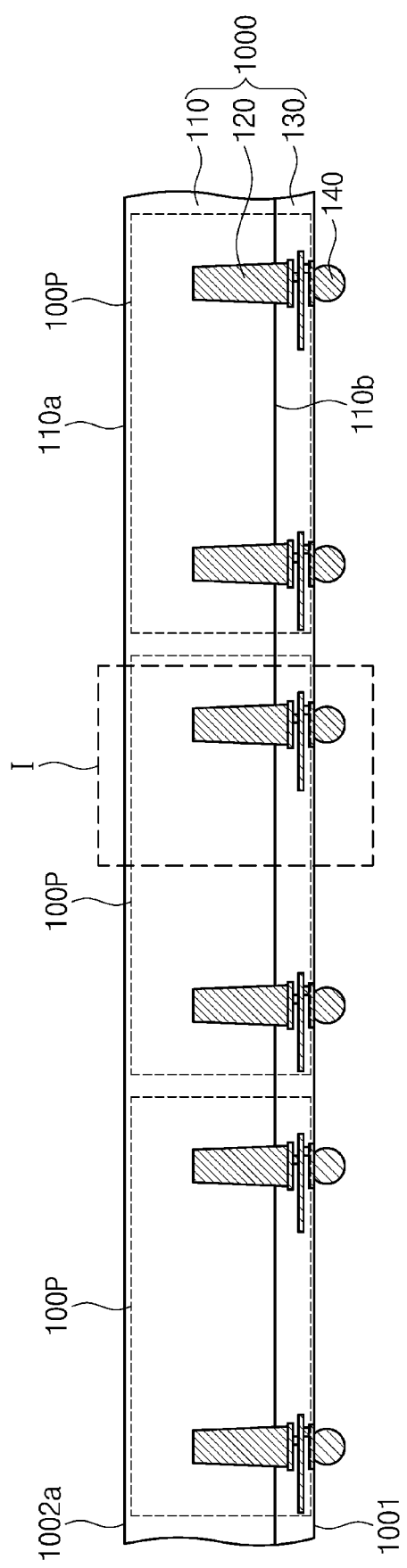

FIG. 1P
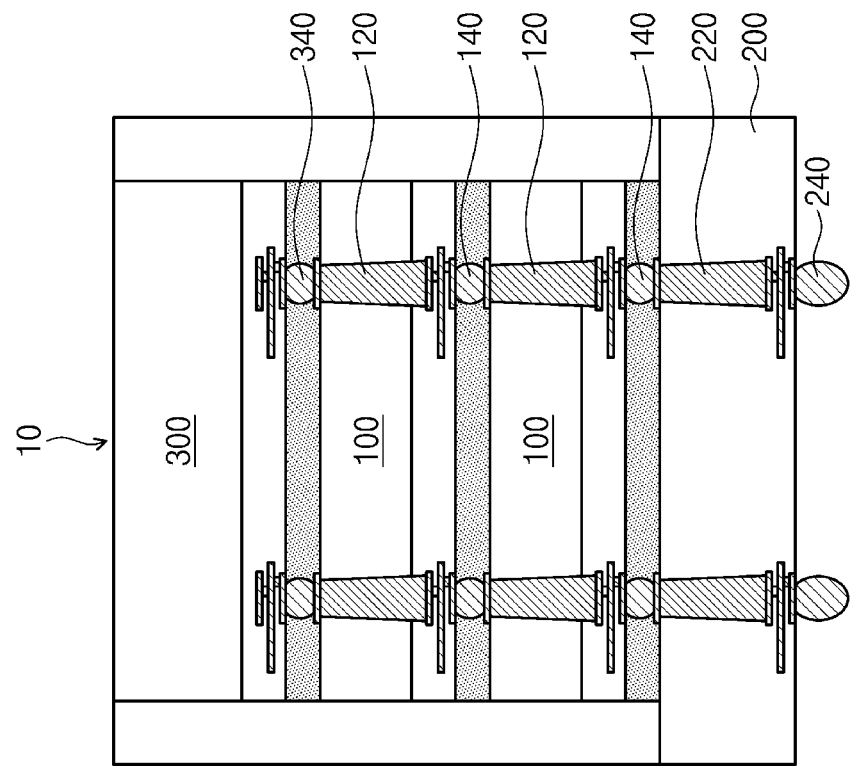
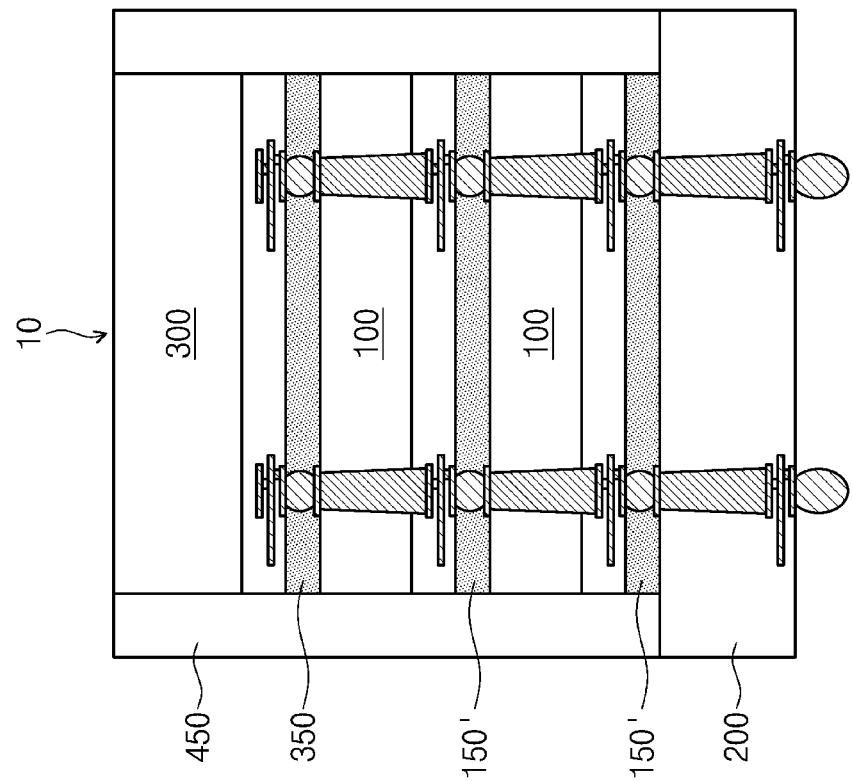

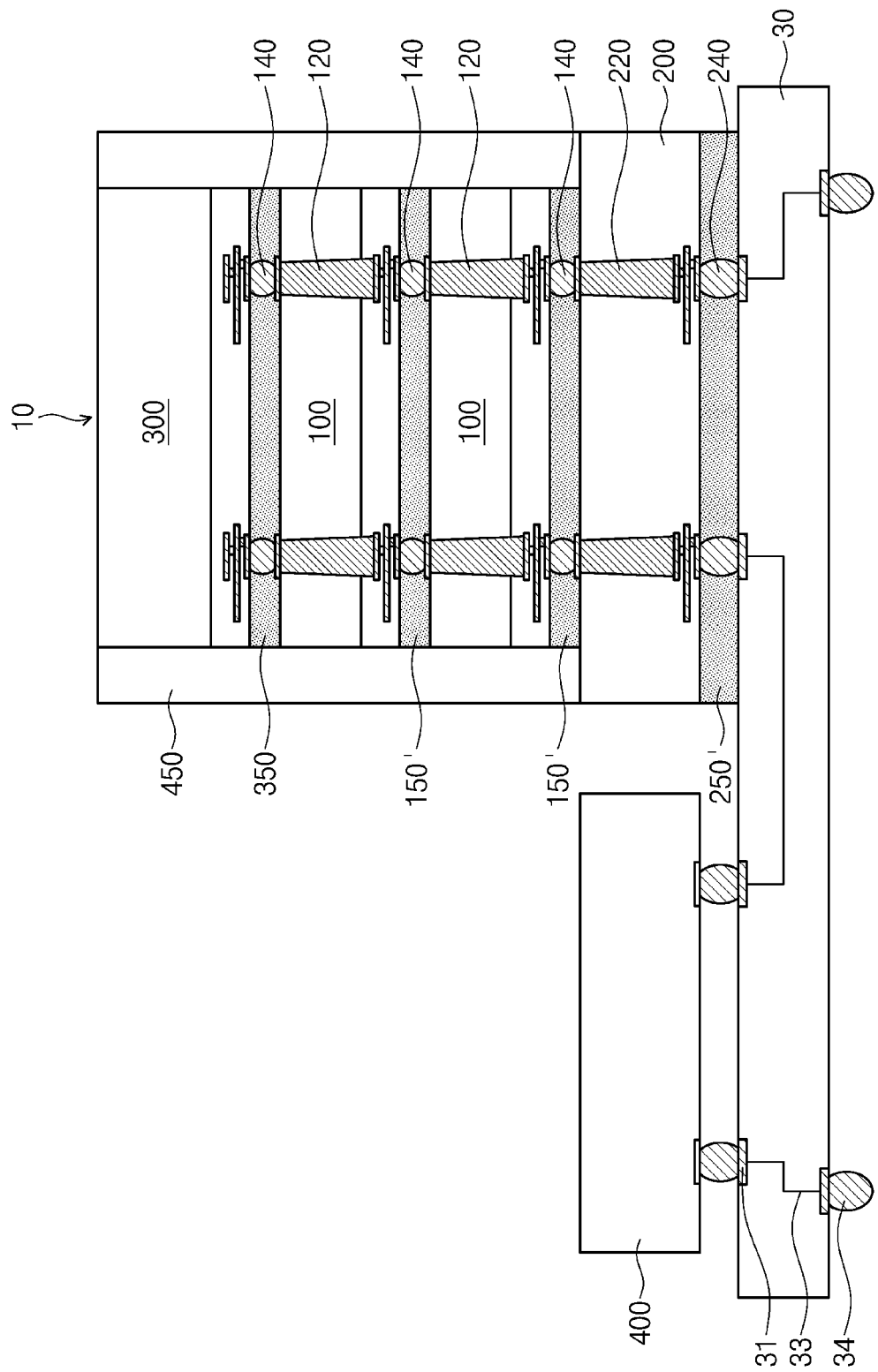

METHOD OF FABRICATING A SEMICONDUCTOR DEVICE USING AN ADHESIVE LAYER

CROSS-REFERENCE TO RELATED APPLICATION

This U.S. non-provisional patent application claims priority under 35 U.S.C. § 119 to Korean Patent Application No. 10-2019-0032017, filed on Mar. 20, 2019, in the Korean Intellectual Property Office, the disclosure of which is incorporated by reference herein in its entirety.

TECHNICAL FIELD

The present inventive concept relates to a method of fabricating a semiconductor device, and more particularly, a method of fabricating a semiconductor device using an adhesive layer.

DISCUSSION OF RELATED ART

Various methods of stacking semiconductor chips have been proposed to realize a semiconductor device with high density and high performance characteristics. For exemplary, a multi-chip package includes a plurality of chips mounted in a single semiconductor package, or a system-in-package including a plurality of stacked chips of different kinds, which are operated as a single system. Semiconductor chips are electrically connected to other semiconductor devices or a printed circuit board through vias. However, the process of stacking the semiconductor chips leads to an increase in complexity of the fabrication process of a semiconductor package. For example, a carrier glue layer is interposed between a semiconductor wafer and a carrier substrate to attach the semiconductor wafer to the carrier substrate. After a process of removing the carrier substrate, the carrier glue layer may be removed by chemical treatment. In the process of removing the carrier glue layer, solder balls may be damaged or there may be leftover residue of the carrier glue layer.

SUMMARY

According to an exemplary embodiment of the present inventive concept, a method of fabricating a semiconductor device is provided in which an adhesive layer is disposed on a first surface of a first semiconductor substrate. A carrier substrate is provided on the first surface of the first semiconductor substrate, and the carrier substrate is separated from a surface of the adhesive layer while the adhesive layer is still attached to the first surface of the first semiconductor substrate.

According to an exemplary embodiment of the present inventive concept, a method of fabricating a semiconductor device is provided, including providing a first semiconductor substrate including a first adhesive layer. A first carrier substrate is provided on the first adhesive layer. The first carrier substrate is removed to expose the first adhesive layer, and the first semiconductor substrate is disposed on a second semiconductor substrate, such that the exposed first adhesive layer faces the second semiconductor substrate.

According to an exemplary embodiment of the present inventive concept, a method of fabricating a semiconductor device includes coating a wafer with a thermosetting polymer layer. A release layer is provided on the thermosetting polymer layer. A carrier substrate is provided on the release layer, and the release layer is removed while the release layer is attached to the carrier substrate to expose the thermosetting polymer layer.

BRIEF DESCRIPTION OF THE DRAWINGS

The above and other features of the present inventive concept will be more clearly understood from the following Detailed Description taken in conjunction with the accompanying drawings, in which:

FIGS. 1A, 1C, 1D, 1E, 1F, 1G, 1H, 1I, 1J, 1K, 1L, 1M, 1N, 1O and 1P are diagrams illustrating a method of fabricating a semiconductor device, according to an exemplary embodiment of the inventive concept.

FIG. 2F is a diagram illustrating a semiconductor package according to an exemplary embodiment of the inventive concept.

It should be noted that these figures are intended to illustrate the general characteristics of methods, structure and/or materials utilized in certain exemplary embodiments and to supplement the written description provided below. These drawings are not, however, necessarily to scale. These drawings may not precisely reflect the structural or performance characteristics of any given exemplary embodiment, and should not be interpreted as defining or limiting the range of values or properties encompassed by the included exemplary embodiments of the present inventive concept. For example, the relative thicknesses and positioning of molecules, layers, regions and/or structural elements may be reduced or exaggerated for clarity. The use of similar or identical reference numbers in the various drawings may indicate the presence of similar or identical elements or features.

DETAILED DESCRIPTION OF THE EMBODIMENTS

Exemplary embodiments of the present inventive concept will now be described more fully with reference to the accompanying drawings.

Figure 1B:
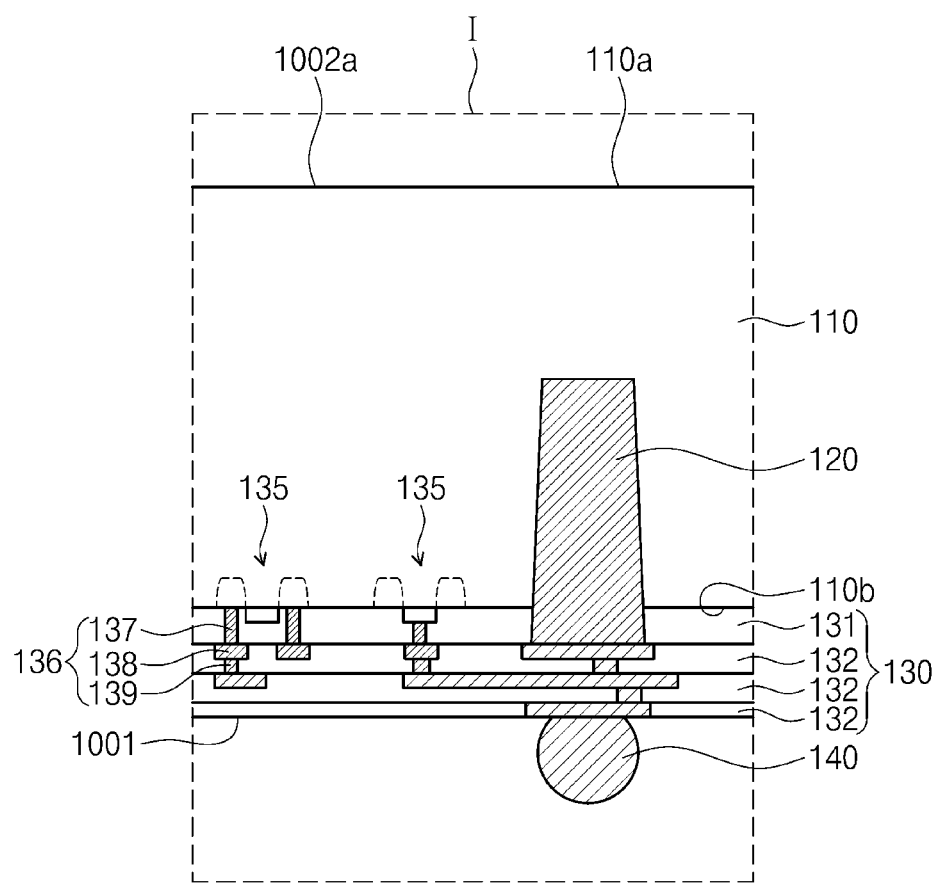
FIG. 1B is an enlarged sectional view of a portion 'I' of FIG. 1A.
Figure 1C:
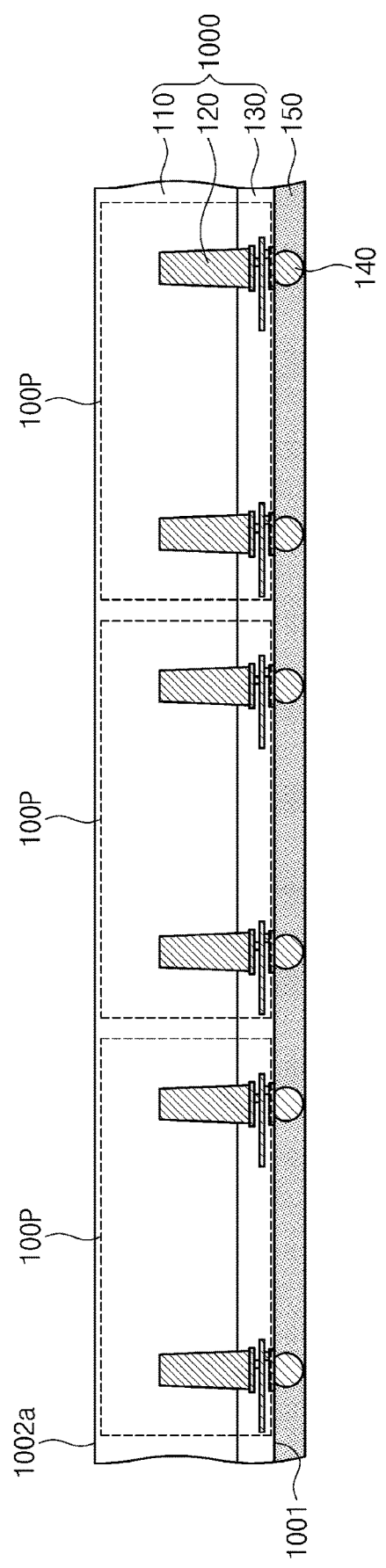
Figure 1D:
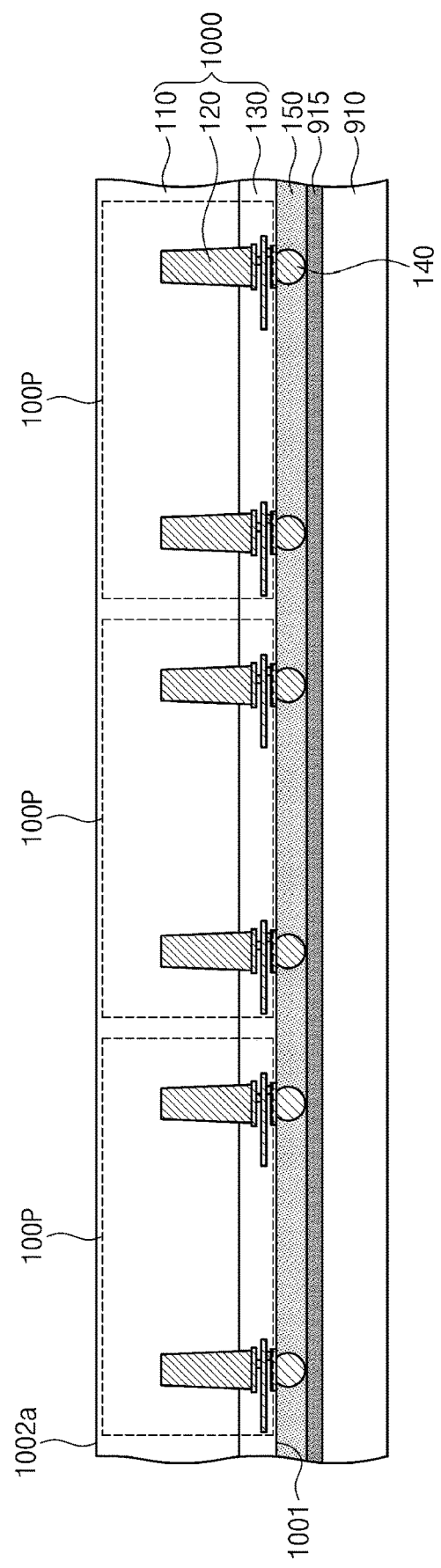

FIGS. 1A, 1C to 1P are diagrams illustrating a method of fabricating a semiconductor device, according to an exemplary embodiment of the inventive concept. FIG. 1B is an enlarged sectional view of a portion 'I' of FIG. 1A. FIG. 1Q is a diagram illustrating a semiconductor package, according to an exemplary embodiment of the inventive concept.

Referring to FIGS. 1A and 1B, a first substrate 1000 may be provided. The first substrate 1000 may include a base substrate 110, a first via structure 120, and a circuit layer 130. The base substrate 110 may be a semiconductor substrate. For example, the base substrate 110 may include a semiconductor material, such as silicon, germanium, and/or silicon-germanium. The base substrate 110 may be a wafer-level substrate (e.g., a semiconductor wafer). The circuit layer 130 may be provided on a bottom surface 110*b* of the base substrate 110. As shown in FIG. 1B, the circuit layer 130 may include transistors 135, a first insulating layer 131, second insulating layers 132, and an interconnection structure 136. The transistors 135 may be provided on the bottom surface 110b of the base substrate 110. The first insulating layer 131 may be provided on the bottom surface 110b of the base substrate 110 to cover the transistors 135. For example, the transistors 135 may be disposed on an upper surface of the first insulating layer 131. The second insulating layers 132 may be stacked on the first insulating layer 131. The first insulating layer 131 and the second insulating layer 132 may be formed of silicon oxide, silicon nitride, and/or silicon oxynitride. The interconnection structure 136 may include a contact plug 137, an interconnection pattern 138, and a via pattern 139. The interconnection structure 136 may include a conductive material (e.g., copper and/or tungsten). The contact plug 137 may penetrate the first insulating layer 131 and may be coupled to the transistors 135. In the present specification, the expression "electrically connected or coupled" may mean that a plurality of elements are directly connected/coupled to each other or are indirectly connected or coupled to each other via another conductive element. The interconnection pattern 138 may be provided between two adjacent layers from among the first insulating layer 131 and the second insulating layers 132. The via pattern 139 may penetrate at least one of the second insulating layers 132 and may be coupled to the interconnection pattern 138.

The first via structure 120 may be provided in the circuit layer 130 and the first substrate 1000. For example, the first via structure 120 may penetrate a portion of the base substrate 110 and the first insulating layer 131, and the portion of the base substrate 110 may correspond to a lower portion of the base substrate 110. The first via structure 120 may not be exposed to the outside through a top surface 110a of the base substrate 110. The first via structure 120 may include a conductive material (e.g., copper, titanium, and/or tungsten). The first via structure 120 may be coupled to the interconnection structure 136. A plurality of the first via structures 120 may be provided, as shown in FIG. 1A.

First connection terminals 140 may be provided on a bottom surface of the circuit layer 130. The first connection terminals 140 may include a solder ball, a bump, a pillar, or any combination thereof. The first connection terminals 140 may include a conductive material such as tin, lead and/or silver. The first connection terminals 140 may be connected to the transistors 135 and/or the first via structures 120 through the interconnection structure 136. For example, the first via structure 120 may be electrically connected to both a first connection terminal 140 and a transistor 135 through a common interconnection pattern 138. The first via structure 120 and the first connection terminals 140 may transmit or receive electrical signals to or from the transistors 135. In the present specification, the expression "an element is electrically connected to a semiconductor chip" may mean that the element is electrically connected to integrated circuits of the semiconductor chip. Integrated circuits of first semiconductor chips 100 may include the transistors 135.

The first substrate 1000 may have a first surface 1001 and a second surface 1002a that are opposite to each other. The first surface 1001 of the first substrate 1000 may correspond to the bottom surface of the circuit layer 130, and the second surface 1002a of the first substrate 1000 may correspond to the top surface 110a of the base substrate 110.

As shown in FIG. 1A, the first substrate 1000 may include a plurality of first preliminary semiconductor chips 100P. The first preliminary semiconductor chips 100P may be connected to each other, for example, without any interface therebetween. The first preliminary semiconductor chips 100P may be used as the first semiconductor chips 100, respectively, as described with reference to FIG. 1J. Each of the first preliminary semiconductor chips 100P may include a corresponding portion of the base substrate 110, the first via structures 120, and a corresponding portion of the circuit layer 130. Hereinafter, in order to reduce complexity in the drawings and to provide better understanding of the present inventive concept, the transistors 135, the first insulating layer 131 and the second insulating layer 132, and the interconnection structure 136 are omitted in all figures, except FIG. 1B.

Referring to FIG. 1C, a first adhesive layer 150 may be formed on the first surface 1001 of the first substrate 1000 to cover the first connection terminals 140 and the circuit layer 130. The first adhesive layer 150 may include a thermosetting polymer layer. The thermosetting polymer layer may include, for exemplary, epoxy-based polymers. The first adhesive layer 150 may have a glass transition temperature ranging from 180° C. to 300° C. The first adhesive layer 150 may serve as an insulating layer.

As an example, the first adhesive layer 150 may be formed by attaching a non-conductive film to the first surface 1001 of the first substrate 1000. As another example, the formation of the first adhesive layer 150 may include coating a thermosetting polymer layer on the first surface 1001 of the first substrate 1000 and hardening the thermosetting polymer layer.

A first carrier substrate 910 may be disposed on the first substrate 1000. For example, referring to FIG. 1D, the first carrier substrate 910 may be disposed on a first surface 1001. A first release layer 915 may be provided between the first adhesive layer 150 and the first carrier substrate 910. The first substrate 1000 and the first adhesive layer 150 may be attached to the first carrier substrate 910 by the first release layer 915. As an example, the first release layer 915 may include an adhesive polymer. As another example, the first release layer 915 may include a silicon-based insulating material. The silicon-based insulating material may include siloxane-based materials, such as polydimethylsiloxane and/or hexamethyldisiloxane.

Figure 1E:
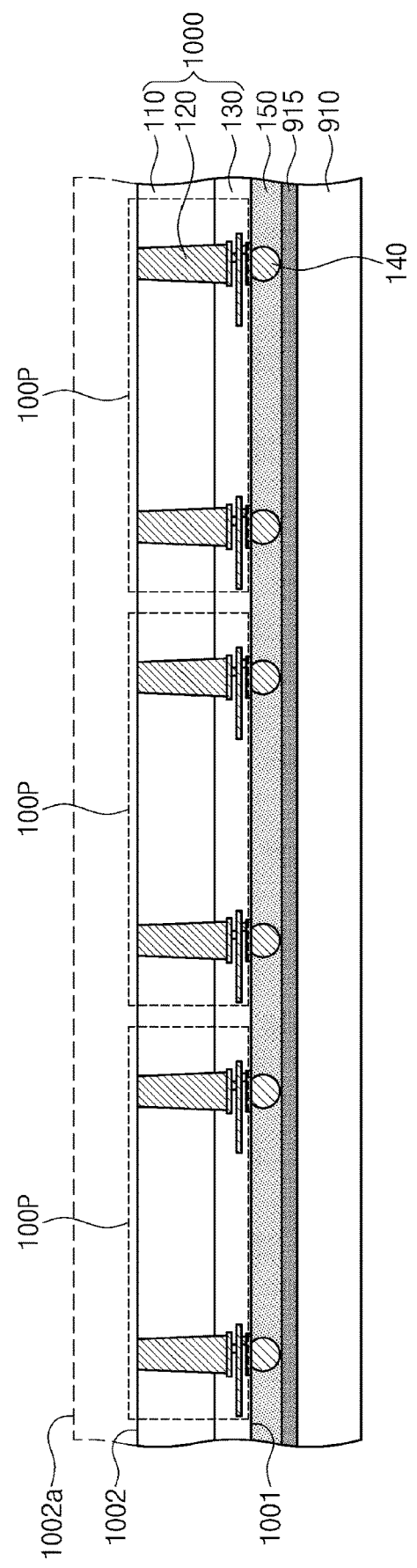

Referring to FIG. 1E, a polishing process may be performed on the second surface 1002a of the first substrate 1000 to thin the first substrate 1000. The polishing process may include a chemical mechanical polishing process. When the polishing process is finished, the first via structures 120 may be exposed to the outside through the polished second surface 1002 of the first substrate 1000.

Figure 1F:
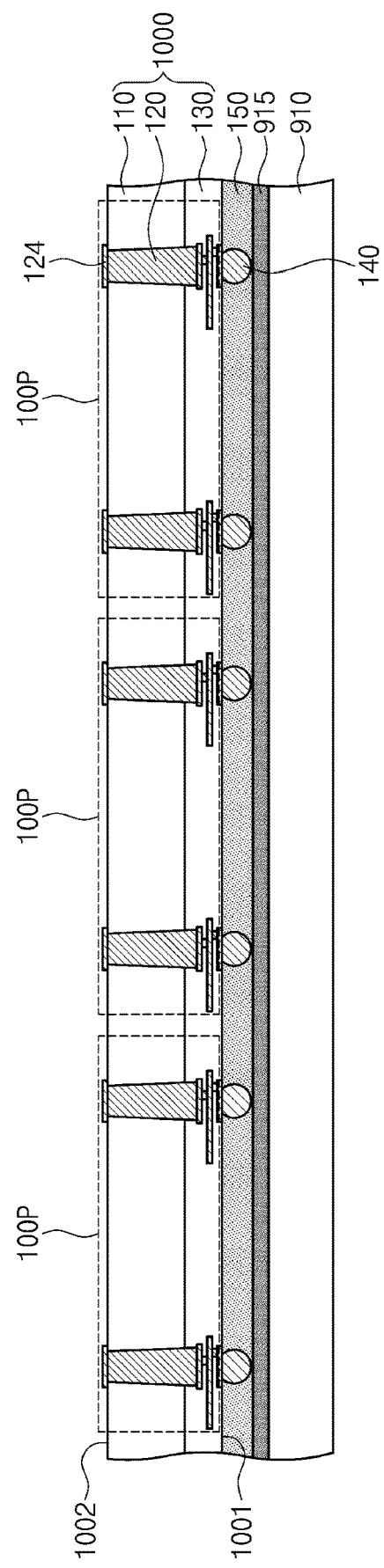

Referring to FIG. 1F, first conductive pads 124 may be formed on the polished second surface 1002 of the first substrate 1000. The first conductive pads 124 may be coupled to corresponding first via structures 120. A backside insulating layer may be further formed between the first conductive pads 124 and the polished second surface 1002 of the first substrate 1000.

Figure 1G:
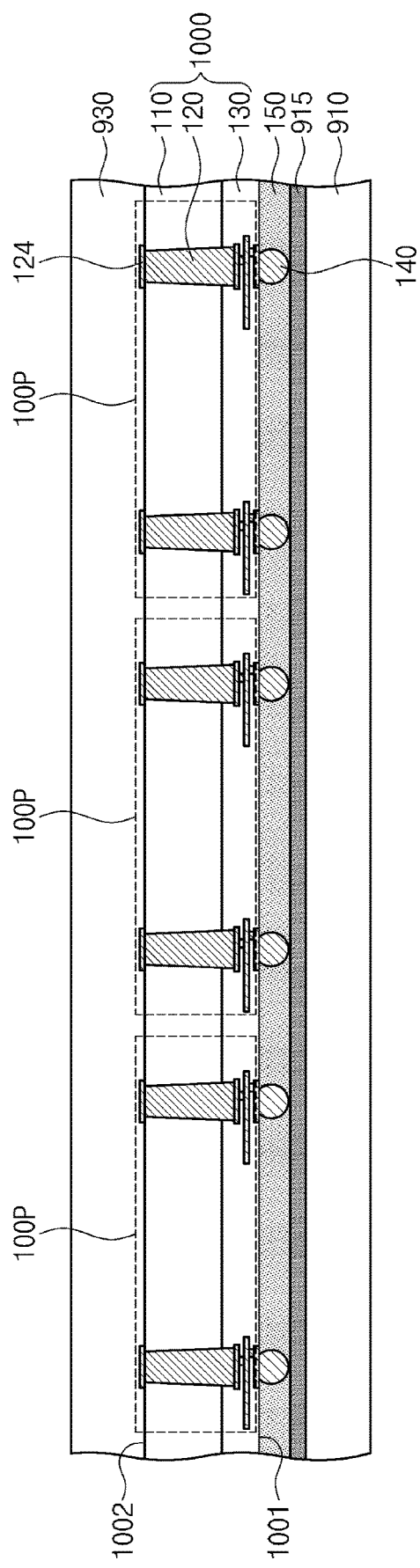

Referring to FIG. 1G, a support substrate 930 may be provided on the polished second surface 1002 of the first substrate 1000 to cover the first conductive pads 124. The support substrate 930 may include a thermosetting polymer material. For example, a protection tape may be used as the support substrate 930. Even when the first substrate 1000 is thinned in the step shown in FIG. 1E, the first substrate 1000 may be easily handled, due to the presence of the support substrate 930.

Figure 1H:
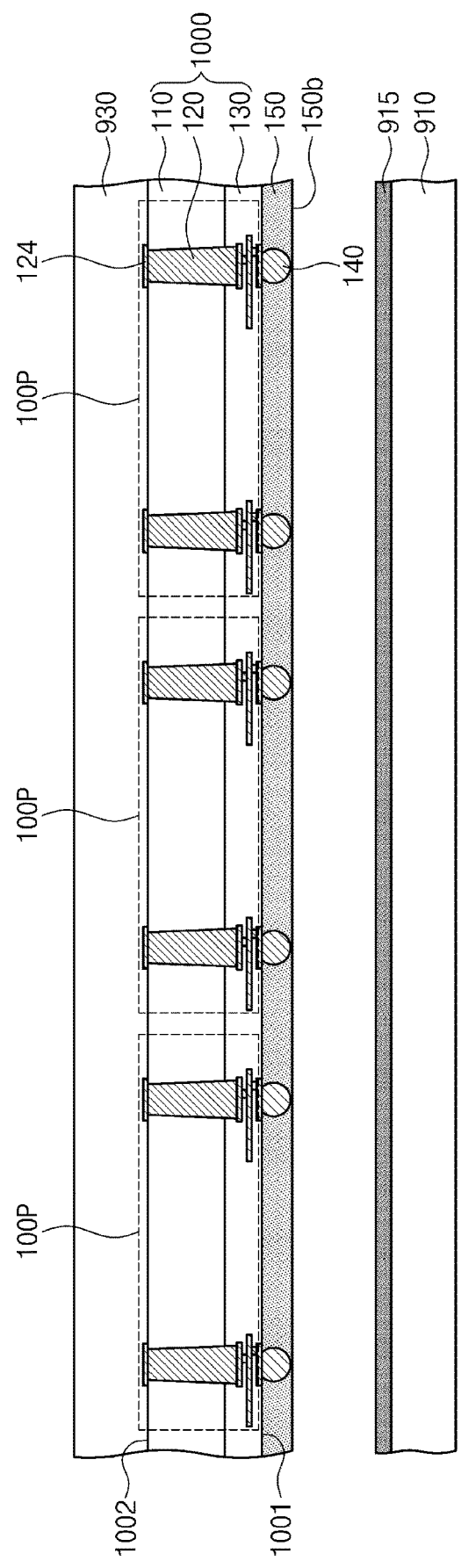

Referring to FIG. 1H, the first release layer 915 and the first carrier substrate 910 may be removed. In an exemplary embodiment of the present inventive concept, ultraviolet light may be irradiated onto the first carrier substrate 910 and the first release layer 915. The ultraviolet light may lead to a change in chemical characteristics of the first release layer 915. Thus, an adhesion strength between the first release layer 915 and the first adhesive layer 150 may become weaker than an adhesion strength between the first release layer 915 and the first carrier substrate 910. The first carrier substrate 910, along with the first release layer 915, may be separated from the first adhesive layer 150 by a physical or mechanical method. For example, the first release layer 915 attached to the first carrier substrate 910 may be peeled or pulled from the first substrate 1000 at an interface between the first release layer 915 and the first adhesive layer 150. A bottom surface 150b of the first adhesive layer 150 may be exposed.

A carrier glue layer, instead of the first adhesive layer 150, may be formed between the first substrate 1000 and the first carrier substrate 910 to attach the first substrate 1000 to the first carrier substrate 910. In this case, it may be necessary to remove the carrier glue layer, after the removal of the first carrier substrate 910. The carrier glue layer may include an acrylic polymer. The process of removing the carrier glue layer may be performed using a chemical substance. In the process of removing the carrier glue layer, the first connection terminals 140 may be damaged or a residue of the carrier glue layer may be formed on the first surface 1001 of the first substrate 1000. Furthermore, after the process of removing the carrier glue layer, it may be necessary to form an insulating film on the first surface 1001 of the first substrate 1000.

According to an exemplary embodiment of the present inventive concept, since the first adhesive layer 150 and the first release layer 915 are provided, the process of removing the carrier glue layer and forming the insulating film may be omitted. Thus, a process of fabricating a semiconductor device 10 may be simplified. In addition, since the process of removing the carrier glue layer is omitted, it may be possible to prevent the first connection terminals 140 from being damaged and to prevent defects associated with residue of the carrier glue layer. This may make it possible to fabricate a highly-reliable semiconductor device.

The first adhesive layer 150 may cover the first surface 1001 of the first substrate 1000 and the first connection terminals 140 during the processes of: thinning the first substrate 1000 in FIG. 1E, of forming the first conductive pads 124 in FIG. 1F, of attaching the support substrate 930 in FIG. 1G, and of removing the first carrier substrate 910 in FIG. 1H. Thus, the first connection terminals 140 may not be exposed to the outside.

According to an exemplary embodiment of the present inventive concept, the process of thinning the first substrate 1000 in FIG. 1E, of forming the first conductive pads 124 in FIG. 1F, of attaching the support substrate 930 in FIG. 1G, and of removing the first carrier substrate 910 in FIG. 1H may be performed within a temperature range from 20° C. to 180° C. In the case where the first adhesive layer 150 is omitted, the first substrate 1000 may be damaged during the aforementioned processes. The damage of the first substrate 1000 may mean, for example, warpage of the first substrate 1000, which may be caused by heat. The glass transition temperature of the first adhesive layer 150 may be higher than a process temperature of thinning the first substrate 1000 in FIG. 1E, of forming the first conductive pads 124 in FIG. 1F, of attaching the support substrate 930 in FIG. 1G, or of removing the first carrier substrate 910 in FIG. 1H. For example, the first adhesive layer 150 may have a glass transition temperature ranging from 180° C. to 300° C. The first adhesive layer 150 may stably fasten the first substrate 1000 during the processes of FIGS. 1E to 1H, and thus damage (e.g., warpage) of the first substrate 1000 may be prevented from occurring. Accordingly, a fabrication yield of the semiconductor device may be increased.

Figure 1I:
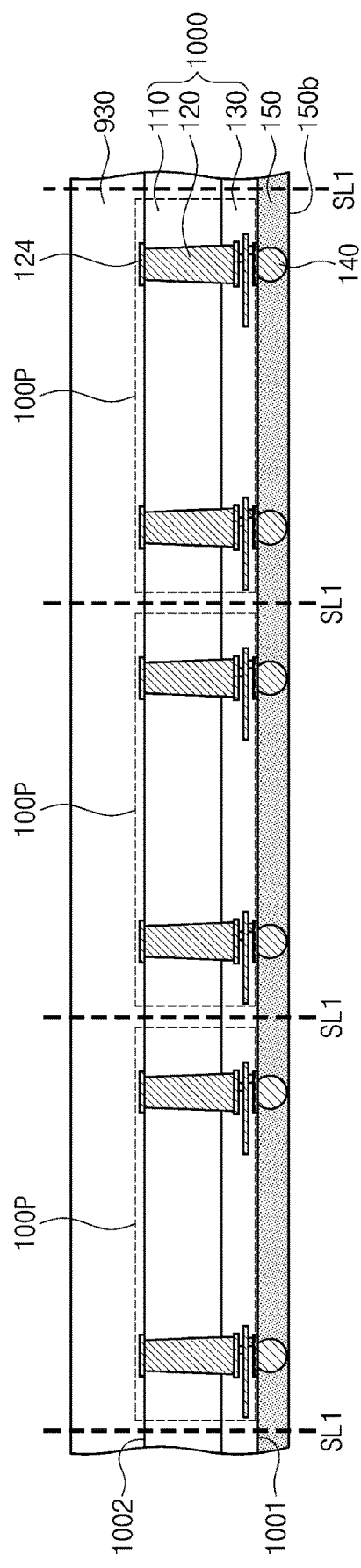
Figure 1J:
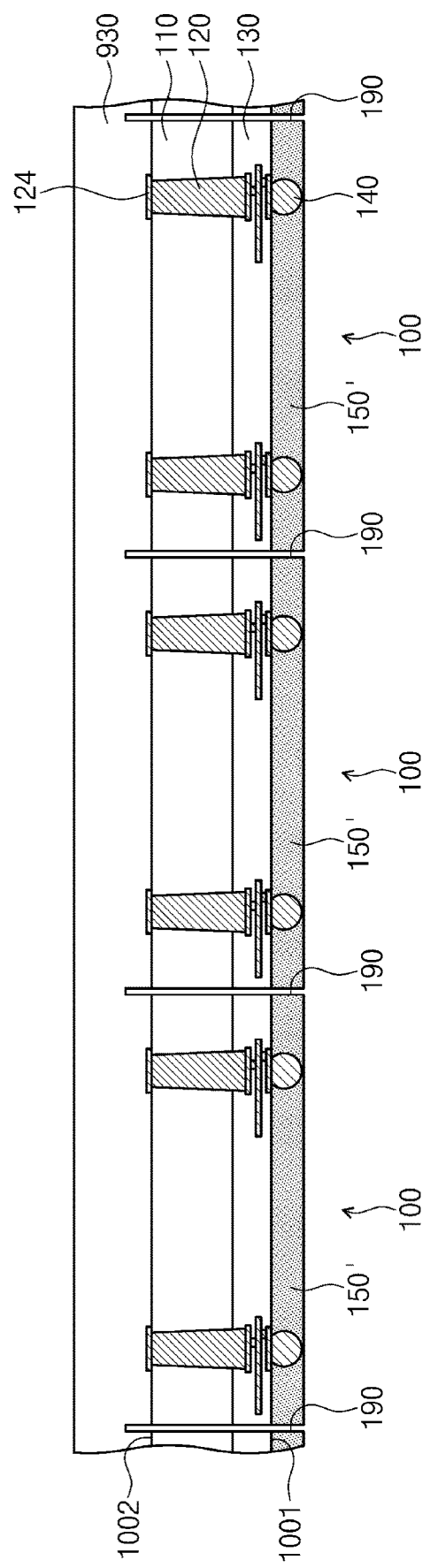

Referring sequentially to FIGS. 1I and 1J, a first sawing process may be performed on the exposed bottom surface 150b of the first adhesive layer 150. The first sawing process may include cutting the first adhesive layer 150 and the first substrate 1000 along first separation lines SL1, using a cutting wheel or laser. The first separation lines SL1 may be provided between the first preliminary semiconductor chips 100P to define the first preliminary semiconductor chips 100P. The first separation lines SL1 may correspond to imaginary lines.

As shown in FIG. 1J, grooves 190 may be formed by the first sawing process, and the grooves 190 may be formed to penetrate the first adhesive layer 150 and the first substrate 1000. The first sawing process may be performed to cut the first substrate 1000 and to separate the first preliminary semiconductor chips 100P from each other. When the first preliminary semiconductor chips 100P are separated from each other, they may refer to first semiconductor chips 100. Each of the first semiconductor chips 100 may include the sawed base substrate 110, the sawed circuit layer 130, the first via structures 120, and the first connection terminals 140. The first semiconductor chips 100 may be memory chips. The first adhesive layer 150 of FIG. 1I may be divided into a plurality of first adhesive layers 150' shown in FIG. 1J, as the result of the first sawing process. Each of the first adhesive layers 150' may be attached to a corresponding one of the first semiconductor chips 100. The first semiconductor chips 100 and the first adhesive layers 150' may be divided by the grooves 190. The divided portions of the first adhesive layers 150' may also be referred to as adhesive patterns. Hereinafter, for convenience and consistence in description, the divided portions of the first adhesive layers 150' will be referred to as the first adhesive layers 150'.

A lower portion of the support substrate 930 may be further sawed in the first sawing process, and in this case, the grooves 190 may also be formed in the lower portion of the support substrate 930. The grooves 190 may not be extended to an upper portion of the support substrate 930. For example, the grooves 190 may separate adjacent first preliminary semiconductor chips 100P, and may extend from the first adhesive layer 150 in a thickness direction perpendicular to a plane of the substrate 100 to at least partially penetrate through the support substrate 930 at or above a height of a parallel extending side of an area bounded by the first preliminary semiconductor chips 100P. Accordingly, the first semiconductor chips 100 may be easily handled. For example, the first semiconductor chips 100 may be in a state that is attached to the support substrate 930, when they are stored or delivered. Each of the first semiconductor chips 100 may be separated from the support substrate 930, when a need arises. In the case where a predetermined number of the first semiconductor chips 100 are needed, the predetermined number of the first semiconductor chips 100 may be separated from the support substrate 930. Here, each of the first semiconductor chips 100 may be separated, along with a corresponding one of the first adhesive layer 150'. In the case where more of the first semiconductor chips 100 are needed, the first semiconductor chips 100, as many as needed, may be separated from the support substrate 930.

Figure 1K:
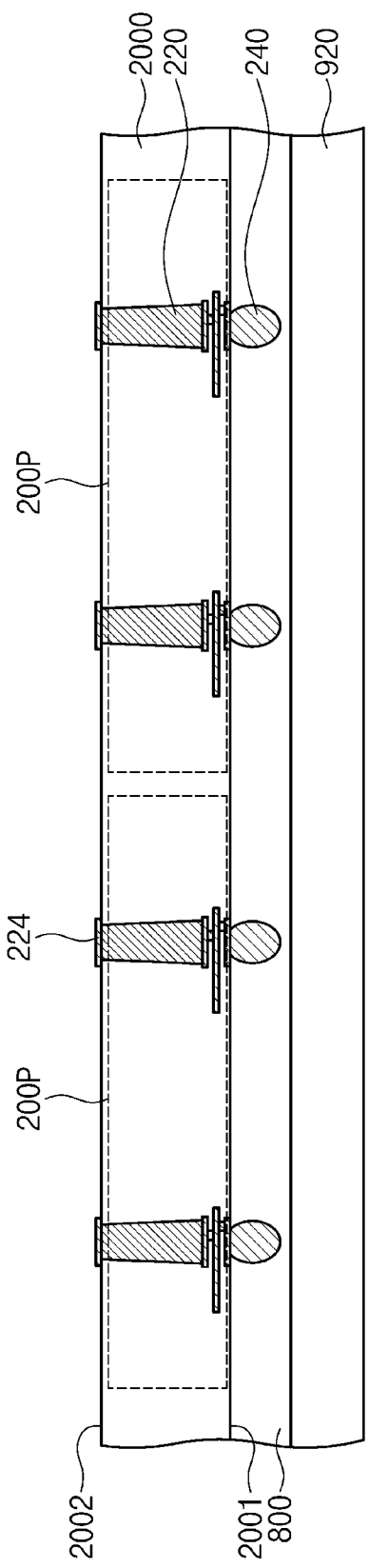

Referring to FIG. 1K, a second substrate 2000 may be prepared. The second substrate 2000 may include a semiconductor substrate. For example, the second substrate 2000 may include a semiconductor wafer. The second substrate 2000 may have a top surface 2002 and a bottom surface 2001, which are opposite to each other.

The second substrate 2000 may include a plurality of second preliminary semiconductor chips 200P, which are connected to each other. Each of the second preliminary semiconductor chips 200P may include integrated circuits, such as logic circuits, which are provided therein, and may serve as a logic chip or a buffer chip. The second preliminary semiconductor chips 200P may include second via structures 220. The second via structures 220 may be provided in the second substrate 2000. The second via structures 220 may be coupled to integrated circuits of the second preliminary semiconductor chips 200P. Second conductive pads 224 may be provided on the top surface 2002 of the second substrate 2000 and may be coupled to the second via structures 220. Second connection terminals 240 may be provided on the bottom surface 2001 of the second substrate 2000. The second connection terminals 240 may be electrically connected to integrated circuits of the second preliminary semiconductor chips 200P or the second via structures 220. The second connection terminals 240 may include a solder ball, a bump, a pillar, or any combination thereof. The second connection terminals 240 may include a conductive material, such as tin, lead and/or silver.

The second substrate 2000 may be disposed on a second carrier substrate 920. A glue layer 800 may be interposed between the second carrier substrate 920 and the second preliminary semiconductor chips 200P to cover the second connection terminals 240. The glue layer 800 may attach the second substrate 2000 to the second carrier substrate 920. The glue layer 800 may include, for example, an acrylic polymer.

Figure 1L:
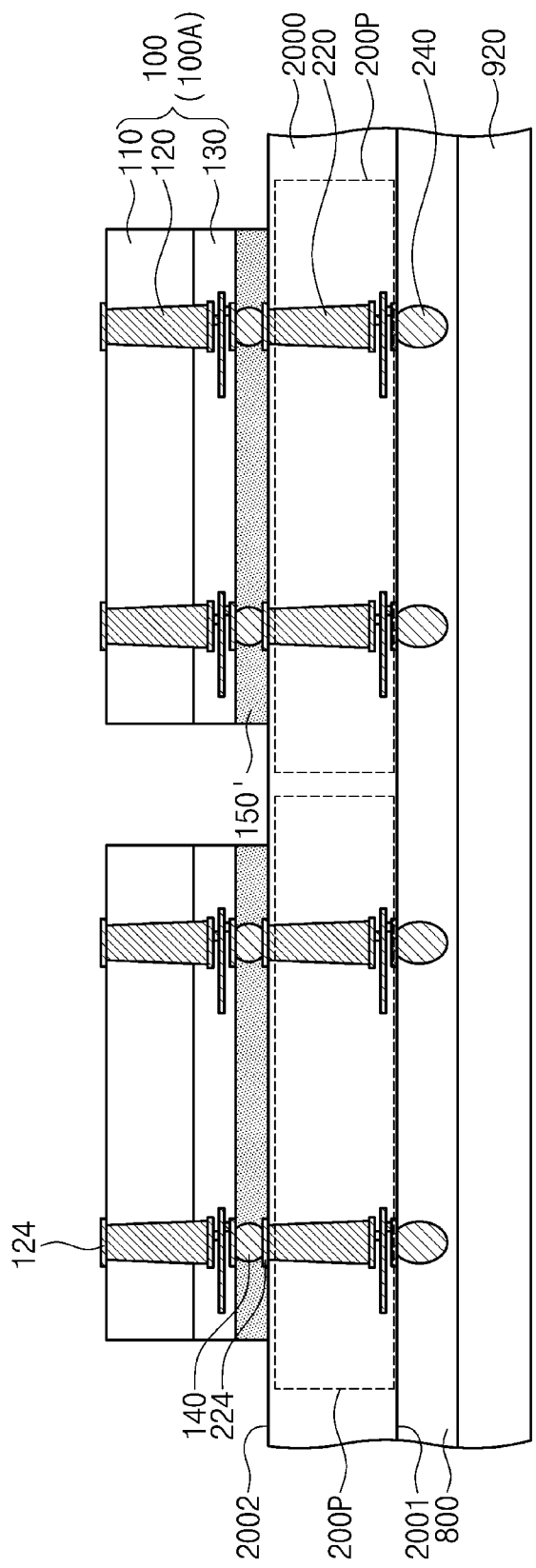

Referring to FIG. 1L, the first semiconductor chips 100 may be mounted on the second substrate 2000. First, the first semiconductor chips 100 may be prepared. For example, at least one of the first semiconductor chips 100 of FIG. 1J, along with a corresponding one of the first adhesive layers 150', may be separated from the support substrate 930. The mounting of the first semiconductor chips 100 on the second substrate 2000 may include disposing the first semiconductor chips 100 on the second substrate 2000 and electrically connecting the first semiconductor chips 100 to the second preliminary semiconductor chips 200P, respectively. Here, the first semiconductor chips 100 may be disposed on the second substrate 2000, such that the first adhesive layers 150' face the second preliminary semiconductor chips 200P. First adhesive layers 150 may contact the second substrate 2000. The first semiconductor chips 100 may be referred to as first sub-semiconductor chips 100A. The first sub-semiconductor chips 100A may be laterally spaced apart from each other. The first connection terminals 140 may be aligned with the second conductive pads 224 of the second preliminary semiconductor chips 200P. Thereafter, a reflow process may be performed on the second substrate 2000 to connect the first connection terminals 140 to the second conductive pads 224. Thus, the first semiconductor chips 100 may be electrically connected to corresponding second preliminary semiconductor chips 200P. The reflow process may be performed at a temperature from 180° C. to 300° C. A width (e.g., a direction perpendicular to a normal plane of the second substrate 2000) of the preliminary semiconductor chips 200P may be greater than a width of the first semiconductor chips 100 disposed thereon. The first semiconductor chips 100 may be vertically aligned over the preliminary semiconductor chips 200P.

Figure 1M:
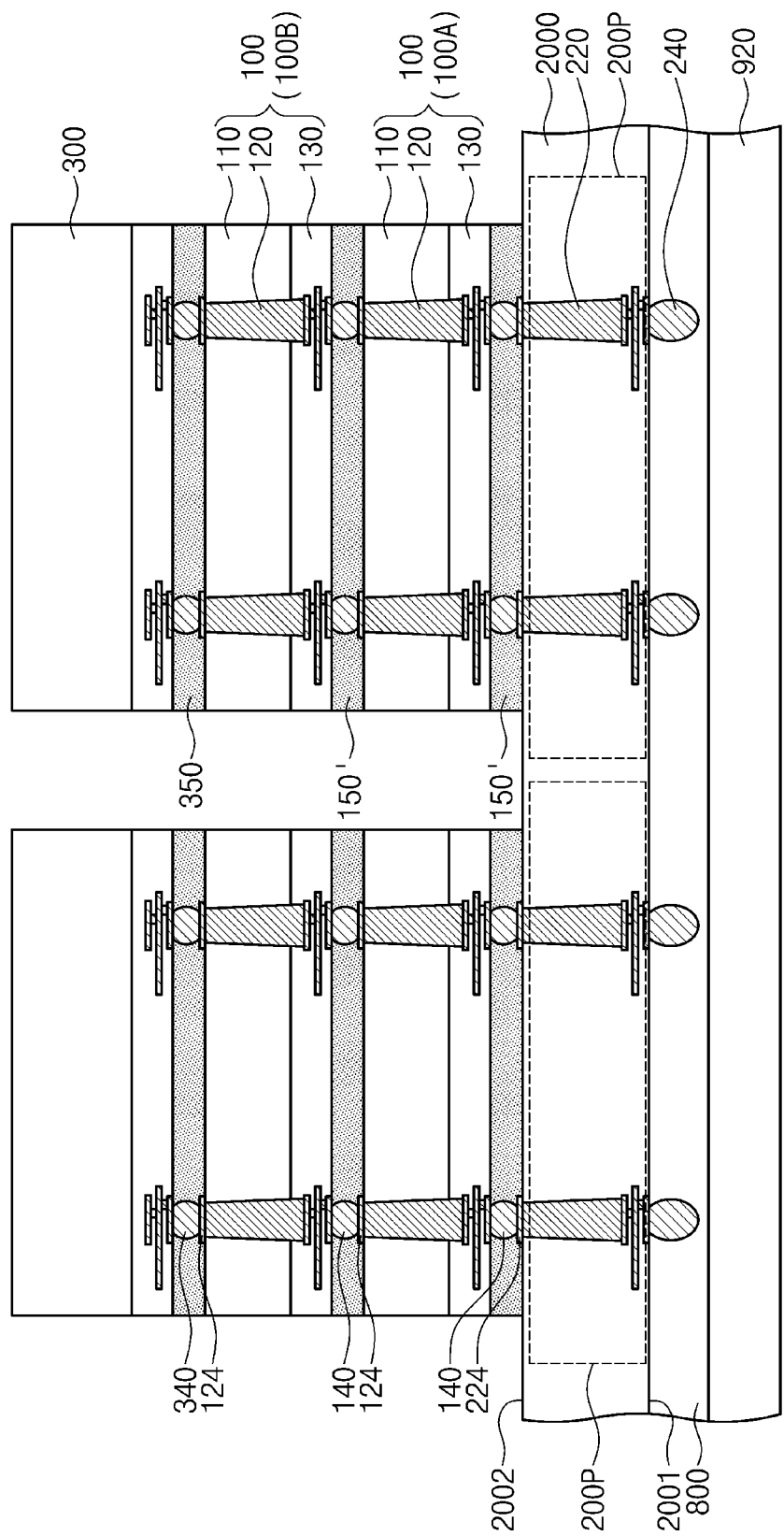

Referring to FIG. 1M, the separating of the first semiconductor chips 100 from the support substrate 930 of FIG. 1J and then mounting the first semiconductor chips 100 on the second preliminary semiconductor chips 200P may be repeatedly performed. Thus, the first semiconductor chips 100 may be vertically stacked on the top surface 2002 of the second substrate 2000 and may be electrically connected to each other. For example, the first semiconductor chips 100 may include second sub-semiconductor chips 100B, which are disposed on the first sub-semiconductor chips 100A. The second sub-semiconductor chips 100B may be laterally spaced apart from each other. The reflow process may be performed to couple the second sub-semiconductor chips 100B to the first sub-semiconductor chips 100A. The first adhesive layers 150' may be further interposed between the first sub-semiconductor chip 100A and the second sub-semiconductor chips 100B. The stacked number of the first semiconductor chips 100 is not limited to that in the illustrated exemplary embodiment and may be variously changed.

Third semiconductor chips 300 may be stacked on uppermost ones of the first semiconductor chips 100. Integrated circuits of the third semiconductor chips 300 may include memory circuits, and the third semiconductor chips 300 may serve as memory chips. Third connection terminals 340 may be interposed between the third semiconductor chips 300 and the uppermost ones of the first semiconductor chips 100. Upper adhesive layers 350 may be interposed between the third semiconductor chips 300 and the uppermost ones of the first semiconductor chips 100 to seal or encapsulate the third connection terminals 340. As an example, the upper adhesive layers 350 may include a material different from the first adhesive layers 150'. The upper adhesive layers 350 may have a glass transition temperature lower than the glass transition temperature of the first adhesive layers 150'. For example, the upper adhesive layers 350 may include a polymer and may have a glass transition temperature ranging from 100° C. to 160° C. (e.g., of about 150° C.). According to an exemplary embodiment of the present inventive concept, the upper adhesive layers 350 may include the same thermosetting polymer as the first adhesive layer 150'. In this case, the upper adhesive layers 350 may have a glass transition temperature ranging from 180° C. to 300° C.

As the result of the reflow process, the third connection terminals 340 may be coupled to the first conductive pads 124 of the uppermost ones of the first semiconductor chips 100. The uppermost ones of the first semiconductor chips 100 may be the second sub-semiconductor chip 100B.

Figure 1N:
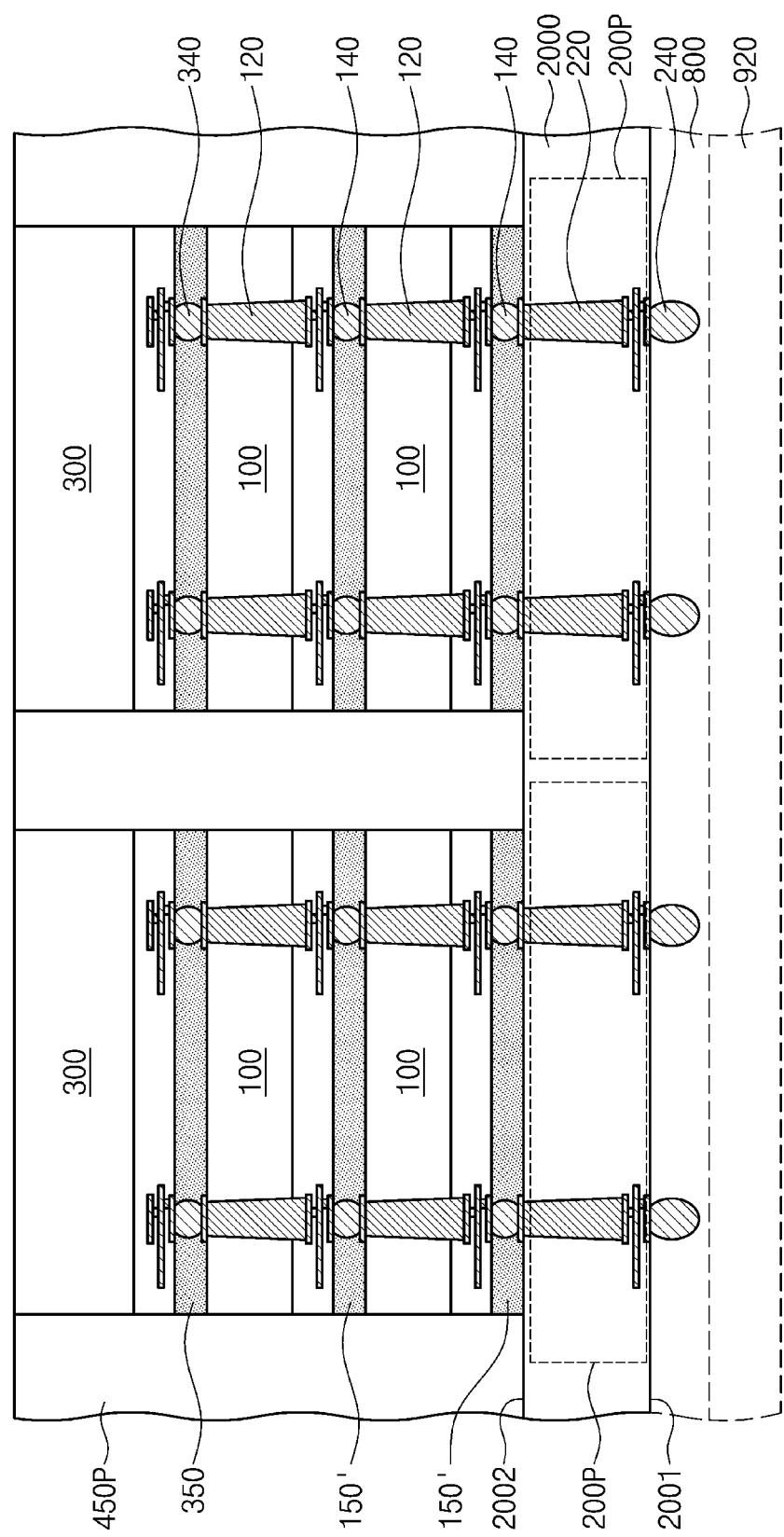
Figure 10:
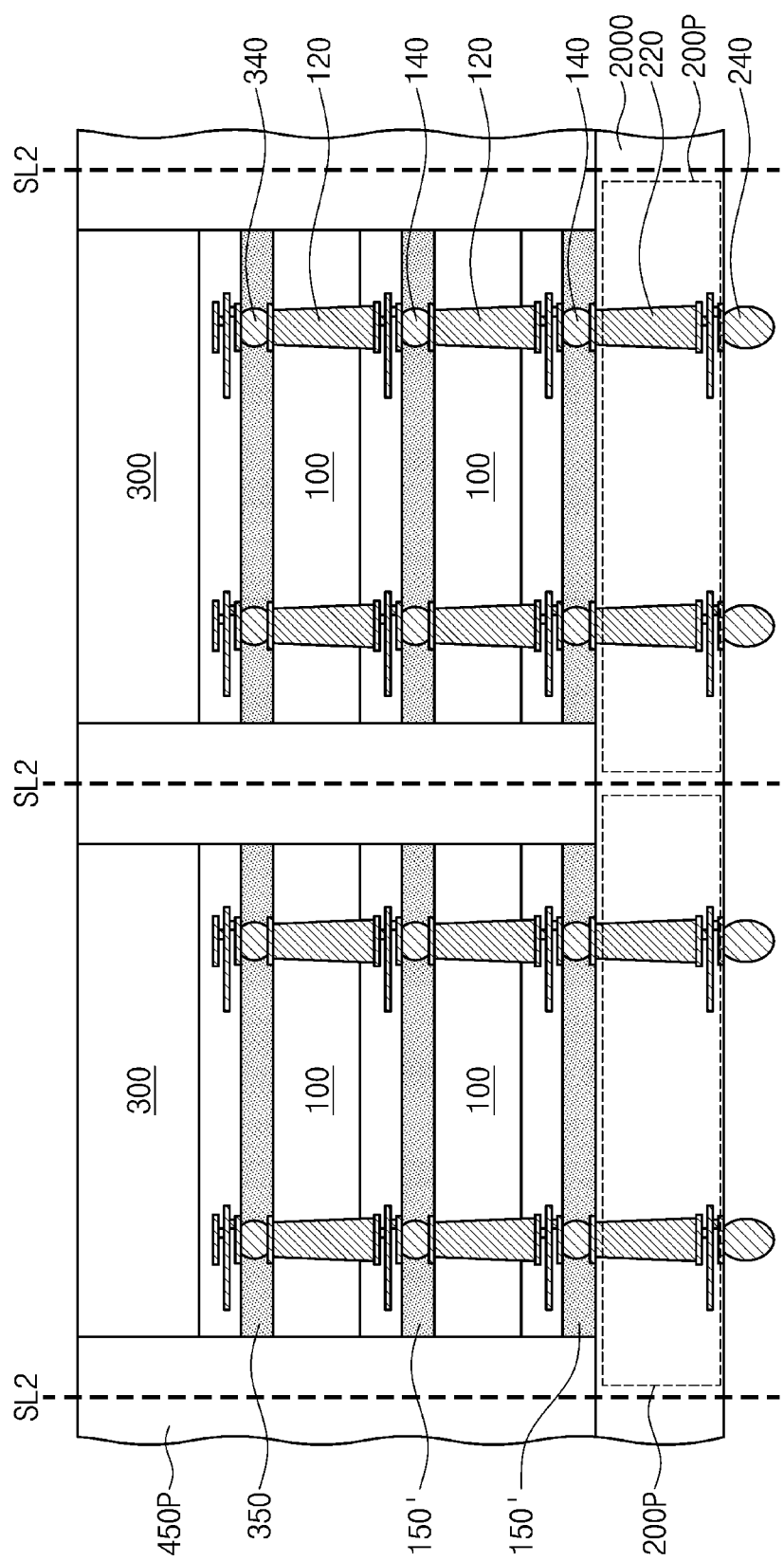
Figure 1Q:
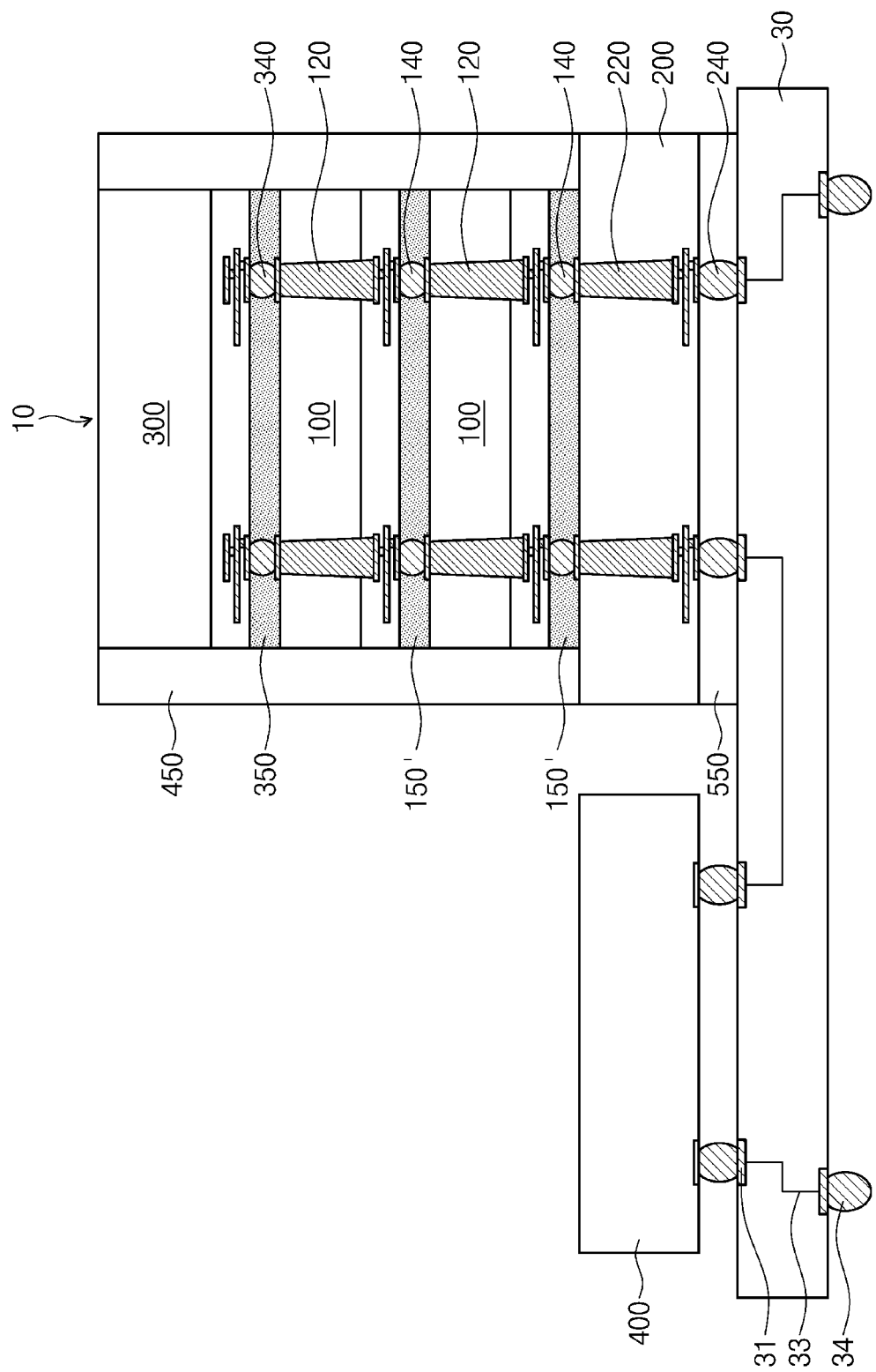
FIG. 1Q is a diagram illustrating a semiconductor package, according to an exemplary embodiment of the inventive concept.

Referring to FIG. 1N, a preliminary mold layer 450P may be formed on the second substrate 2000 to cover the first semiconductor chips 100 and the third semiconductor chips 300. For example, the preliminary mold layer 450P may be formed to cover side surfaces of the semiconductor chips 300, but expose top surfaces of the third semiconductor chips 300. According to an exemplary embodiment of the present inventive concept, unlike the illustrated structure, the preliminary mold layer 450P may be formed to cover the top surfaces of the third semiconductor chips 300. The preliminary mold layer 450P may be provided as a wafer-level element. The preliminary mold layer 450P may include an insulating polymer (e.g., an epoxy molding compound).

As depicted by dotted lines, the second carrier substrate 920 and the glue layer 800 may be removed after the formation of the preliminary mold layer 450P. The removal of the second carrier substrate 920 may be performed by a physical or mechanical method. The glue layer 800 may be exposed by the removal of the second carrier substrate 920. The glue layer 800 may be removed by a cleaning process, in which a chemical substance is used. In an exemplary embodiment of the present inventive concept, the glue layer 800 may be removed to expose the second connection terminals 240 and the bottom surface 2001 of the second substrate 2000.

Referring to FIG. 1O, a second sawing process may be performed on the preliminary mold layer 450P and the second substrate 2000. The second sawing process may include cutting the preliminary mold layer 450P and the second substrate 2000 along second separation lines SL2. The second separation lines SL2 may correspond to imaginary lines that extend in a direction perpendicular to a plane of the second substrate 2000. The second separation lines SL2 may be provided between the second preliminary semiconductor chips 200P.

Referring to FIG. 1P, mold layers 450, which are separated from each other, may be formed by the second sawing process on the preliminary mold layer 450P. In an exemplary embodiment of the present inventive concept, the second sawing process may be performed to cut the second substrate 2000 into a plurality of the second preliminary semiconductor chips 200P, which are separated from each other. The second preliminary semiconductor chips 200P, which are separated from each other, may be used as second semiconductor chips 200. The second semiconductor chips 200 may have a function different from the first semiconductor chips 100. For example, the second semiconductor chips 200 may be logic chips or buffer chips. Each of the second semiconductor chips 200 may include the second via structures 220. As a result, the semiconductor devices 10 may be fabricated. The semiconductor devices 10 may be high bandwidth memory (HBM) devices. Each of the semiconductor devices 10 may include the second connection terminals 240, at least one second semiconductor chip 200, the first adhesive layers 150', the first semiconductor chips 100, the upper adhesive layers 350, at least one third semiconductor chip 300, and a mold layer 450.

Referring to FIG. 1Q, the semiconductor device 10 may be mounted on a substrate 30. The substrate 30 may be an interposer substrate or a printed circuit board. The interposer substrate may include a semiconductor material, such as silicon. Outer terminals 34 may be provided on a bottom surface of the substrate 30. Conductive lines 33 may be provided in the substrate 30. Upper pads 31 may be provided on a top surface of the substrate 30. Some of the upper pads 31 may be electrically connected to each other through the conductive lines 33. Others of the upper pads 31 may be coupled to the outer terminals 34 through the conductive lines 33. The outer terminals 34, the conductive lines 33, and the upper pads 31 may include a conductive material (e.g., a metallic material). In the present specification, an expression "an element is electrically connected to the substrate 30" may mean that the element is electrically connected to the conductive lines 33.

The mounting of the semiconductor device 10 may include disposing the semiconductor device 10 on the substrate 30 and electrically connecting the semiconductor device 10 to the substrate 30. The disposing of the semiconductor device 10 may include aligning the second connection terminals 240 with the upper pads 31. A reflow process may be performed to couple the second connection terminals 240 to the upper pads 31. Thus, the semiconductor device 10 may be coupled to the outer terminals 34. The substrate 30 may thus electrically connect to the semiconductor device 10. An electric connection to the semiconductor device 10 may mean an electric connection to at least one of the second semiconductor chip 200, the first semiconductor chips 100, and the third semiconductor chip 300.

An under-fill layer 550 may be formed between the substrate 30 and the semiconductor device 10 to seal or encapsulate the second connection terminals 240. The under-fill layer 550 may include a material different from the first adhesive layers 150'. The under-fill layer 550 may have a glass transition temperature lower than the glass transition temperature of the first adhesive layer 150'. The under-fill layer 550 may include a polymer and/or resins.

A fourth semiconductor chip 400 may be mounted on the substrate 30. The fourth semiconductor chip 400 may be a semiconductor chip that is of a kind different from the first semiconductor chip 100, the second semiconductor chip 200 and the third semiconductor chip 300. For example, the fourth semiconductor chip 400 may include logic circuits and may serve as an application processor (AP), a central processing unit (CPU), or a graphic processing unit (GPU). The fourth semiconductor chip 400 may be electrically connected to the outer terminals 34 and/or the semiconductor device 10 through the substrate 30. The semiconductor package according to an exemplary embodiment of the inventive concept may be fabricated by the above described fabrication method.

FIGS. 2A to 2E are diagrams illustrating a method of fabricating a semiconductor device, according to an exemplary embodiment of the inventive concept. FIG. 2F is a diagram illustrating a semiconductor package according to an exemplary embodiment of the present inventive concept. For concise description, a previously described elements may be identified by the same reference number without repeating a redundant description thereof.

Figure 2A:
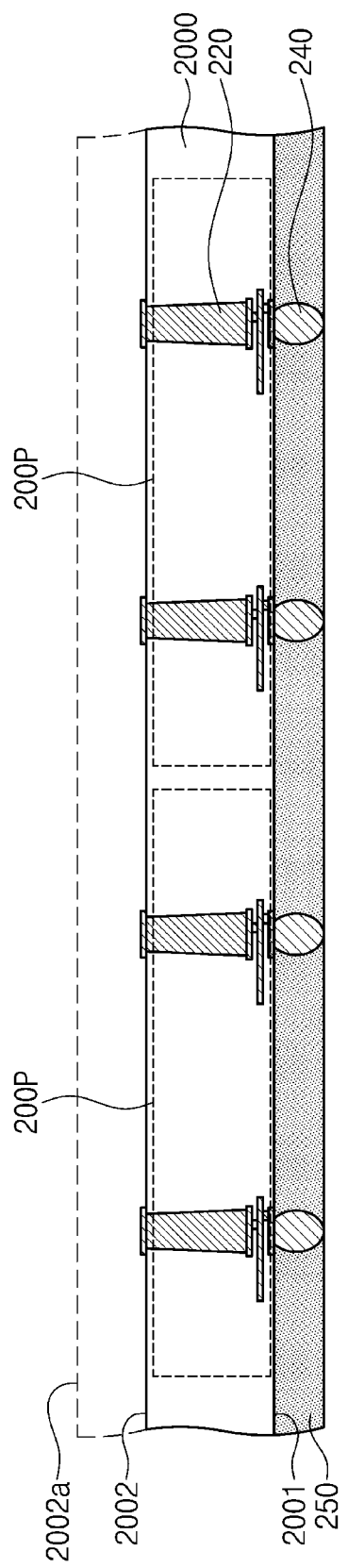
FIGS. 2A, 2B, 2C, 2D and 2E are diagrams illustrating a method of fabricating a semiconductor device, according to an exemplary embodiment of the inventive concept.

Referring to FIG. 2A, the second substrate 2000 may be prepared. However, a second adhesive layer 250, instead of the glue layer, may be formed on the bottom surface 2001 of the second substrate 2000 and may cover the second connection terminals 240. A bottom surface of the second adhesive layer 250 may be positioned at a level equal to or lower than the lowermost surfaces of the second connection terminals 240. The second adhesive layer 250 may include a thermosetting polymer layer. The second adhesive layer 250 may serve as an insulating layer. The thermosetting polymer layer may include, for example, epoxy-based polymers. The second adhesive layer 250 may have a glass transition temperature ranging from 180° C. to 300° C.

As an example, the second adhesive layer 250 may be formed by attaching a non-conductive film to the bottom surface 2001 of the second substrate 2000. As another example, the formation of the second adhesive layer 250 may include coating a thermosetting polymer layer on the bottom surface 2001 of the second substrate 2000 and curing or hardening the thermosetting polymer layer.

After the formation of the second adhesive layer 250, a polishing process may be performed on the top surface 2002a of the second substrate 2000 to thin the second substrate 2000. The polishing process may include a chemical mechanical polishing process. As the result of the polishing process, the second via structures 220 may be exposed to the outside through the polished top surface 2002 of the second substrate 2000. The second conductive pads 224 may be formed on the second via structures 220 after the polishing process. The thinned second substrate 2000 may be substantially the same as the second substrate 2000 described with reference to FIG. 1K.

Figure 2B:
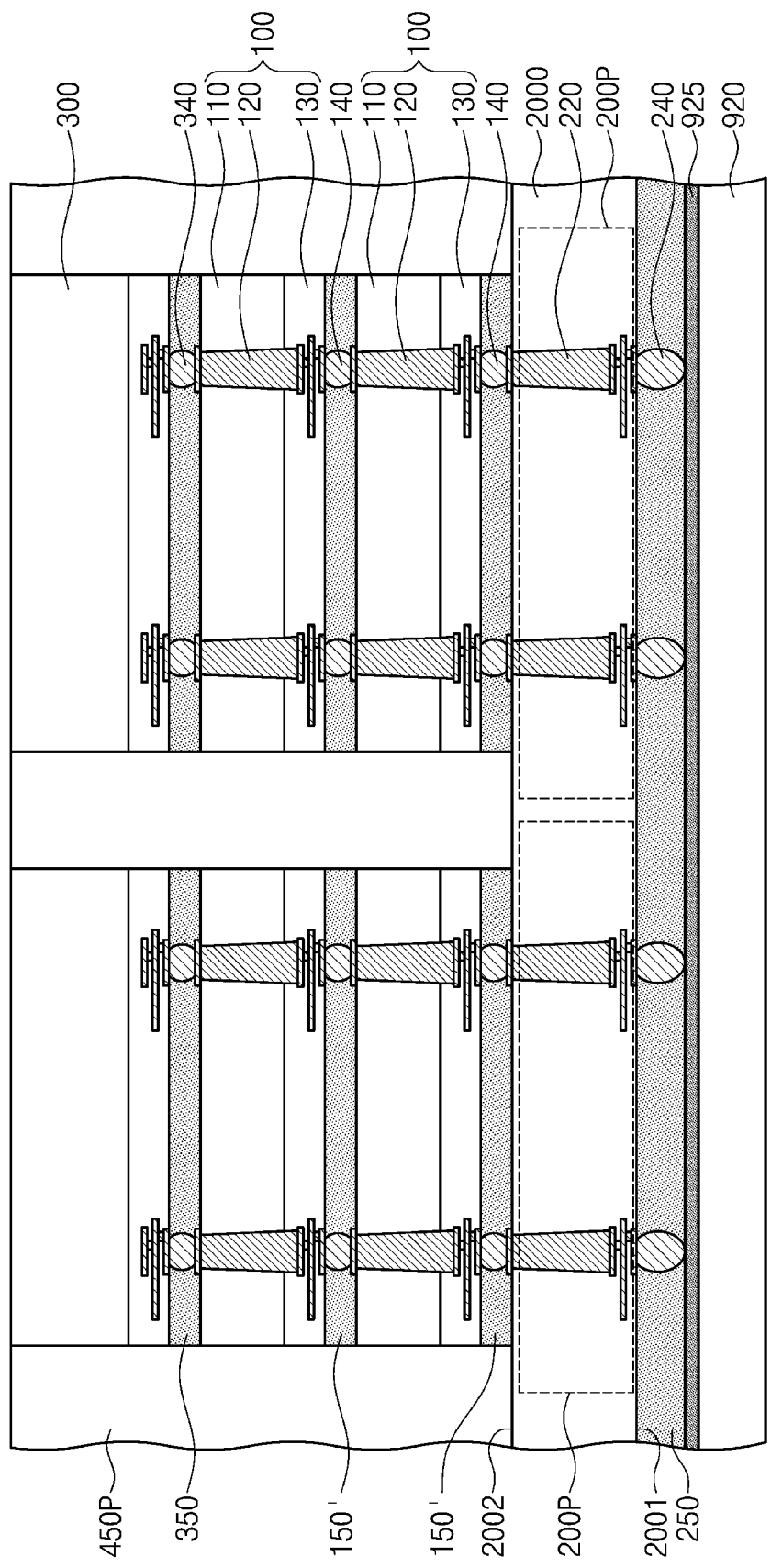

Referring to FIG. 2B, the second substrate 2000 may be disposed on the second carrier substrate 920. A second release layer 925 may be disposed between the second substrate 2000 and the second carrier substrate 920. The second release layer 925 may include the same material as the first release layer 915 described with respect to FIG. 1C.

The first semiconductor chips 100 and the third semiconductor chip 300 may be mounted on the top surface 2002 of the second substrate 2000. The mounting of the first semiconductor chips 100 and the third semiconductor chip 300 may be performed by the method described with reference to FIGS. 1L and 1M. The preliminary mold layer 450P may be formed on the top surface 2002 of the second substrate 2000 to cover the first semiconductor chips 100 and the third semiconductor chips 300. The first adhesive layers 150' may include the same material as the second adhesive layer 250 and may have substantially the same glass transition temperature as the second adhesive layer 250.

Figure 2C:
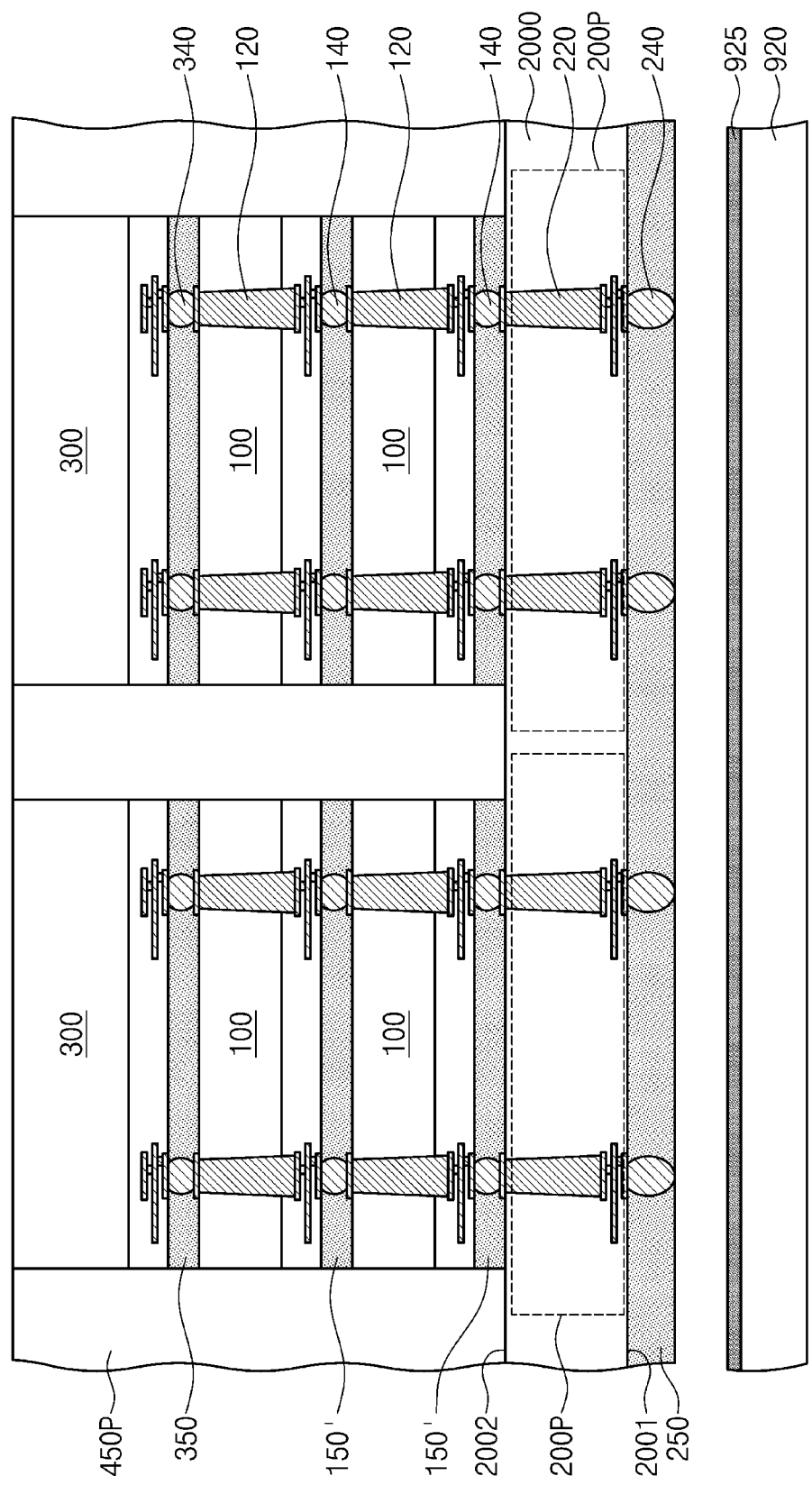

Referring to FIG. 2C, the second carrier substrate 920 and the second release layer 925 may be removed to expose the second adhesive layer 250. The removal of the second carrier substrate 920 and the second release layer 925 may be performed by the same method as the removal process of the first carrier substrate 910 and the first release layer 915, described with reference to FIG. 1H.

Figure 2D:
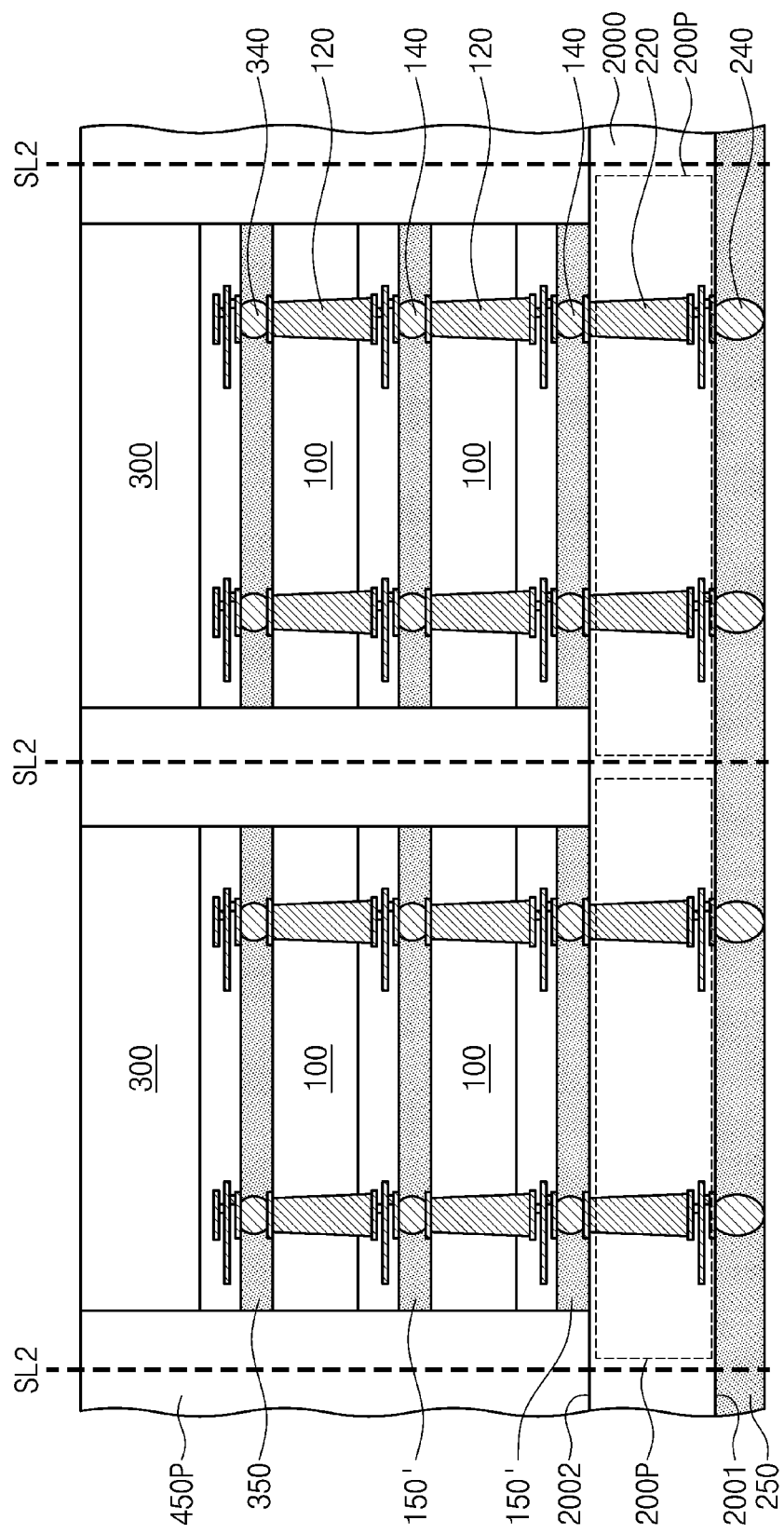
Figure 2E:
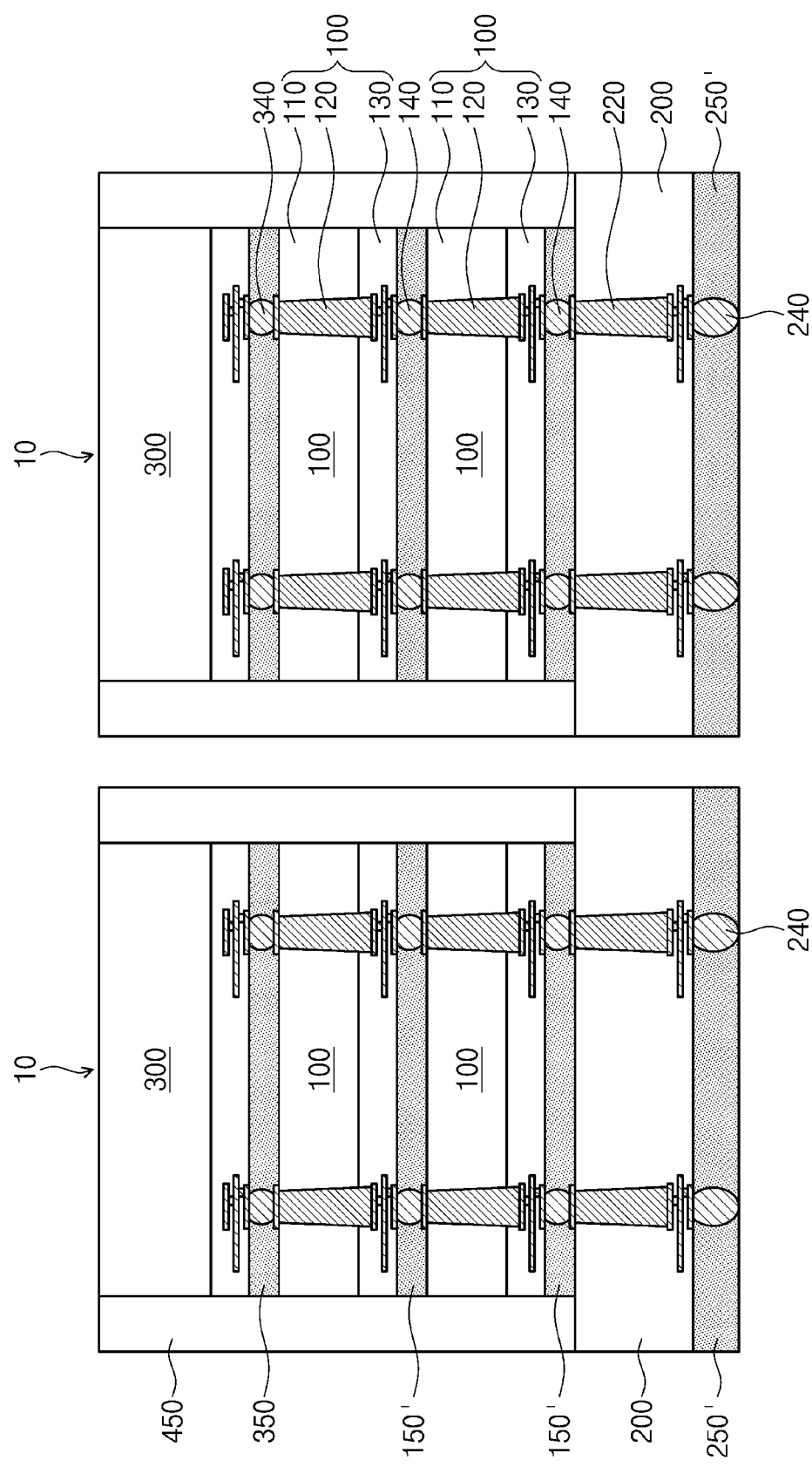

Referring sequentially to FIGS. 2D and 2E, the second sawing process may be performed along the second separation lines SL2. The preliminary mold layer 450P may be sawed to form the mold layers 450. The second substrate 2000 may be sawed to form the second preliminary semiconductor chips 200P, which are separated from each other. The second preliminary semiconductor chips 200P, which are separated from each other, may be used as the second semiconductor chips 200, respectively. Accordingly, the semiconductor devices 10, which are separated from each other, may be fabricated. Each of the semiconductor devices 10 may include the second connection terminals 240, at least one second semiconductor chip 200, the first semiconductor chips 100, at least one third semiconductor chip 300, the first adhesive layers 150', the upper adhesive layer 350, and the mold layer 450. The first semiconductor chips 100 and at least one of the second semiconductor chip 200 and the third semiconductor chip 300 may be electrically connected in a thickness direction of the semiconductor device 10. The second adhesive layer 250 may be divided into a plurality of second adhesive layers 250' by the second sawing process. The second adhesive layers 250', which are separated from each other, may be provided on the bottom surfaces of the corresponding second semiconductor chips 200.

Referring to FIG. 2F, the semiconductor device 10 may be mounted on the substrate 30. The mounting of the semiconductor device 10 may be performed by the same method as that described with reference to FIG. 1Q. However, the process of forming the under-fill layer may be omitted, and the second adhesive layer 250' may be disposed between the substrate 30 and first semiconductor chip 100. The fourth semiconductor chip 400 may be further mounted on the substrate 30. The semiconductor package according to an exemplary embodiment of the present inventive concept may be fabricated by the aforementioned fabrication method. Each of the first to third semiconductor chips 100-300 comprising the semiconductor device 10 may be referred to as a level. Levels of the first semiconductor chip 100 may have first adhesive layers 150' disposed therebetween. The semiconductor device 10 may include a first column and a second column of first and second vias 120 and 220, each of which may have levels electrically connected by first connection terminals 140. The first column may be adjacent to the fourth semiconductor chip 400 and electrically connected thereto by the second connection terminal 240. The levels may send and/or receive electrical signals in a thickness direction of the semiconductor device 10 and the first column may send and/or receive electrical signals to the fourth semiconductor chip 400 in a direction perpendicular to the thickness direction.

According to an exemplary embodiment of the present inventive concept, a carrier substrate may be attached to a first substrate by an adhesive layer and a release layer. The carrier substrate may be removed by separating the release layer from the adhesive layer. It may therefore be possible to omit a process of forming a carrier glue layer, which is in direct contact with the carrier substrate and the first substrate, thereby preventing damage of the first substrate which may occur in a process of removing the carrier glue layer. After a sawing process and a mounting process, the adhesive layer may be interposed between other semiconductor chips within a same stack and the sawed first substrate. Thus, it is possible to omit a process of forming an additional insulating film. Accordingly, it is possible to simplify a process of fabricating a semiconductor device.

During the process of fabricating a semiconductor device, the adhesive layer may be used to stably fasten or hold a substrate, and thus, the substrate may be prevented from being damaged.

While exemplary embodiments of the present inventive concept have been particularly shown and described, it will be understood by one of ordinary skill in the art that variations in form and detail may be made therein without departing from the spirit and scope of the present inventive concept as set forth in the following claims.

What is claimed is:

1. A method of fabricating a semiconductor device, comprising:
    disposing an adhesive layer on a first surface of a first semiconductor substrate to surround connection terminals of the first semiconductor substrate, the first semiconductor substrate including a base substrate; a circuit layer provided on the base substrate and including transistors; and the connection terminals on the circuit layer, the connection terminals exposed on the first surface of the first semiconductor substrate and including solder ball or a solder bump,
    providing a carrier substrate on the first surface of the first semiconductor substrate, the adhesive layer disposed between the carrier substrate and the first surface of the first semiconductor substrate;
    separating the carrier substrate from a surface of the adhesive layer while the adhesive layer is still attached to the connection terminals and the first surface of the first semiconductor substrate; and
    performing a sawing process on the surface of the adhesive layer formerly attached to the carrier substrate.

2. The method of claim 1, wherein the performing of the sawing process further comprises cutting the adhesive layer and the first semiconductor substrate to form first semiconductor chips.

3. The method of claim 2, wherein the sawing process is performed to separate the adhesive layer into a plurality of adhesive patterns, which are attached to the first semiconductor chips, respectively.

4. The method of claim 3, further comprising:
    preparing a second semiconductor substrate including a second semiconductor chip; and
    mounting at least one of the first semiconductor chips on the second semiconductor substrate,
    wherein the adhesive pattern is interposed between the first semiconductor chip and the second semiconductor chip.

5. The method of claim 2, wherein sidewalls of the connection terminals are covered by the adhesive layer, during the separating of the carrier substrate and the performing of the sawing process.

6. The method of claim 1, further comprising performing a polishing process on a second surface of the first semiconductor substrate, which is opposite to the first surface of the first semiconductor substrate.

7. The method of claim 1, wherein the adhesive layer comprises a thermosetting polymer and has a glass transition temperature from 180° C. to 300° C.

8. The method of claim 1, wherein the providing of the carrier substrate further comprises forming a release layer between the adhesive layer and the carrier substrate.

9. The method of claim 8, wherein the separating of the carrier substrate comprises separating the release layer from the adhesive layer.

10. A method of fabricating a semiconductor device, comprising:
providing a first semiconductor substrate including connection terminals and an adhesive layer covering opposite sides of each of the connection terminals, wherein the connection terminals include a solder ball or a solder bump;
providing a carrier substrate on the adhesive layer;
removing the carrier substrate to expose the adhesive layer;
disposing the first semiconductor substrate on a second semiconductor substrate, such that the exposed adhesive layer faces a second surface of the second semiconductor substrate, conductive pads are provided on the second surface of the second semiconductor substrate; and
disposing the adhesive layer formerly attached to the carrier substrate directly onto the second surface of the second semiconductor substrate.

11. The method of claim 10, further comprising forming grooves penetrating the adhesive layer and the first semiconductor substrate to form first semiconductor chips separated from each other.

12. The method of claim 11, wherein the second semiconductor substrate comprises a second semiconductor chip including the conductive pads,
wherein the disposing of the first semiconductor substrate on the second semiconductor substrate comprises:
electrically connecting the connection terminals to the second semiconductor chip.

13. The method of claim 12, further comprising:
forming first via structures in the first semiconductor substrate; and
forming second via structures in the second semiconductor substrate,
wherein the electrically connecting of the connection terminals to the second semiconductor chip comprises coupling the connection terminals to the second via structures.

14. The method of claim 11, wherein a glass transition temperature of the adhesive layer is higher than process temperatures in the removing of the carrier substrate and in the forming of the grooves.

15. The method of claim 10, wherein the providing of the carrier substrate comprises providing a release layer between the adhesive layer and the carrier substrate, and
wherein the removing of the carrier substrate comprises separating the release layer from the adhesive layer included on the first semiconductor substrate.

16. A method of fabricating a semiconductor device, comprising:
providing a wafer, the wafer including a base substrate, a circuit layer provided on the base substrate and including transistors, and connection terminals disposed on a first surface of the circuit layer, wherein the connection terminals include a solder ball or a solder bump;
coating the wafer with a thermosetting polymer layer, the thermosetting polymer layer covering the connection terminals and the first surface of the circuit layer;
providing a release layer on the thermosetting polymer layer;
providing a carrier substrate on the release layer,
removing the release layer while the release layer is attached to the carrier substrate to expose the thermosetting polymer layer; and
performing a sawing process on the thermosetting polymer layer to separate the wafer into a plurality of semiconductor chips,
wherein the thermosetting polymer layer covers the connection terminals during the removing of the release layer and the carrier substrate and the performing of the sawing process.

17. The method of claim 16, further comprising
mounting a first semiconductor chip of the plurality of semiconductor chips on a second semiconductor substrate,
wherein the thermosetting polymer layer is interposed between the first semiconductor chip and the second semiconductor substrate.

18. The method of claim 16, wherein the sawing process is performed on the exposed surface of the thermosetting polymer layer after the removing of the release layer.

19. The method of claim 16, wherein a glass transition temperature of the thermosetting polymer layer is higher than process temperatures in the providing of the carrier substrate, in the removing of the release layer and the carrier substrate, and in the performing of the sawing process.

* * * * *